United States Patent
Luetke

(10) Patent No.: US 9,436,090 B2
(45) Date of Patent: Sep. 6, 2016

(54) EXPOSURE APPARATUS AND A METHOD FOR CONTROLLING RADIATION FROM A LAMP FOR EXPOSING A PHOTOSENSITIVE ELEMENT

(71) Applicant: E I DU PONT DE NEMOURS AND COMPANY, Wilmington, DE (US)

(72) Inventor: Helmut Luetke, Frankfurt am Main (DE)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 240 days.

(21) Appl. No.: 14/244,293

(22) Filed: Apr. 3, 2014

(65) Prior Publication Data

US 2014/0313497 A1     Oct. 23, 2014

Related U.S. Application Data

(60) Provisional application No. 61/813,319, filed on Apr. 18, 2013.

(51) Int. Cl.
*G03F 7/20* (2006.01)
*B41C 1/00* (2006.01)

(52) U.S. Cl.
CPC .............. *G03F 7/201* (2013.01); *B41C 1/00* (2013.01); *G03F 7/20* (2013.01); *G03F 7/2002* (2013.01); *G03F 7/2008* (2013.01); *G03F 7/2014* (2013.01); *G03F 7/2041* (2013.01); *G03F 7/2051* (2013.01); *G03F 7/70558* (2013.01);

(Continued)

(58) Field of Classification Search
CPC ...... G03F 7/20; G03F 7/2002; G03F 7/2008; G03F 7/2004; G03F 7/2014; G03F 7/2041; G03F 7/2051; G03F 7/70558; G03F 7/70858; G03F 7/70875; G03F 7/7005
See application file for complete search history.

(56) References Cited

U.S. PATENT DOCUMENTS

| 4,619,050 A | 10/1986 | Klemm |
| 4,665,627 A | 5/1987 | Wilde et al. |
| 4,792,829 A * | 12/1988 | Firmani ................. G03B 27/72 |
| | | 355/38 |

(Continued)

FOREIGN PATENT DOCUMENTS

| CA | 2220108 | 5/1996 | |
| FR | WO 2013007922 A1 * | 1/2013 | ........... G03F 7/2004 |
| IT | EP 1316847 A1 * | 6/2003 | ........... G03F 7/2004 |

OTHER PUBLICATIONS

D. Galton, "A Study of the Effects of the Process Parameters on the Characteristics of Photochemical Flexographic Print Plates", Pigment & Resin Technology, vol. 32, No. 4, 2003, pp. 235-247.

*Primary Examiner* — Steven H Whitesell Gordon
(74) *Attorney, Agent, or Firm* — Simon L. Xu

(57) ABSTRACT

The invention pertains to an exposure apparatus, a method for controlling a photosensitive element to radiation using the exposure apparatus, and a method for exposing a photosensitive element to radiation. The exposure apparatus includes a base assembly having an exposure bed that supports the photosensitive element, and a lamp housing assembly having two or more lamps. The lamp housing assembly includes an adjustable ballast connected to at least one of the lamps to adjust power received by the one lamp, a sensor for measuring irradiance impinging the exposure bed; and a controller that adjusts the adjustable ballast based on comparison of the measured irradiance to the target irradiance, thereby adjusting the irradiance emitting from the lamp to the target irradiance.

18 Claims, 13 Drawing Sheets

(52) U.S. Cl.
CPC ....... *G03F 7/70858* (2013.01); *G03F 7/70875* (2013.01)

(56) References Cited

U.S. PATENT DOCUMENTS

| | | | |
|---|---|---|---|
| 4,857,382 A * | 8/1989 | Liu | B29C 59/16 |
| | | | 156/345.5 |
| 4,922,078 A | 5/1990 | Ulrich et al. | |
| 4,978,891 A | 12/1990 | Ury | |
| 5,206,518 A | 4/1993 | Fedor et al. | |
| 5,763,892 A * | 6/1998 | Kizaki | G03F 7/16 |
| | | | 250/492.1 |
| 5,804,922 A | 9/1998 | Dolan et al. | |
| 5,983,800 A | 11/1999 | Barral et al. | |
| 6,693,382 B2 | 2/2004 | Little et al. | |
| 6,872,936 B2 | 3/2005 | Rathod et al. | |
| 7,544,948 B2 | 6/2009 | Schonlein et al. | |
| 7,935,940 B1 | 5/2011 | Smargiassi | |
| 8,241,835 B2 * | 8/2012 | Rudolph | G03F 7/0858 |
| | | | 430/306 |
| 8,468,940 B2 | 6/2013 | Luetke et al. | |
| 2007/0287091 A1 * | 12/2007 | Jacobo | G03F 7/2008 |
| | | | 430/154 |
| 2008/0258069 A1 * | 10/2008 | Nonaka | G03F 7/70275 |
| | | | 250/372 |
| 2010/0321663 A1 | 12/2010 | Luetke et al. | |
| 2011/0095196 A1 | 4/2011 | Stockdale | |
| 2014/0117257 A1 * | 5/2014 | Bertrand | G03F 7/2004 |
| | | | 250/492.1 |

* cited by examiner

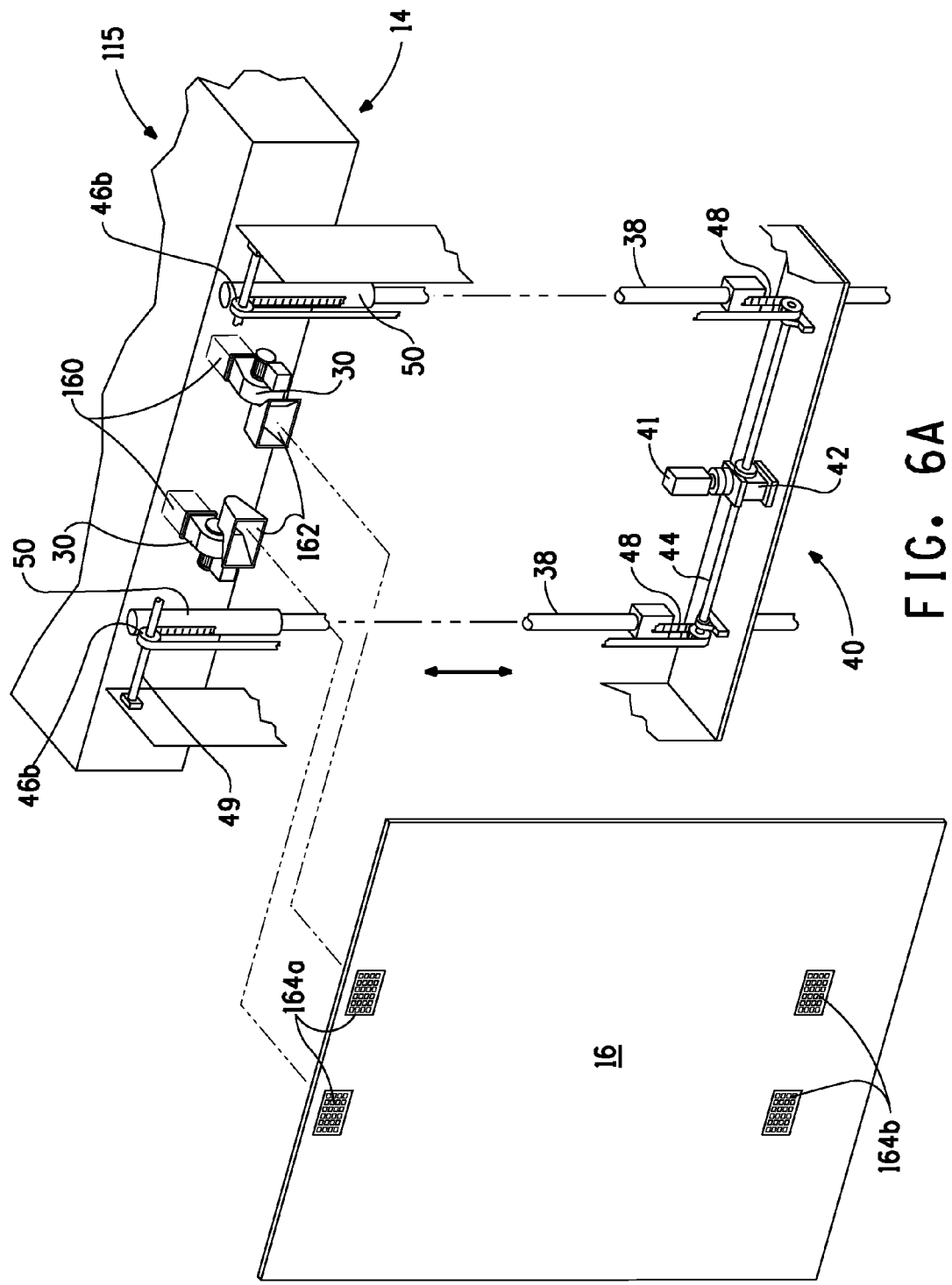

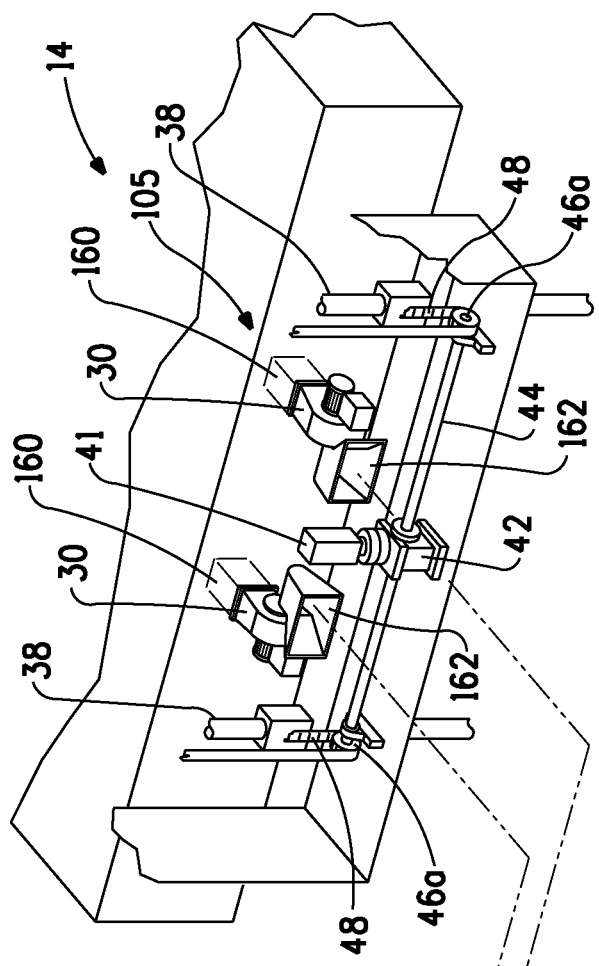
FIG. 6B
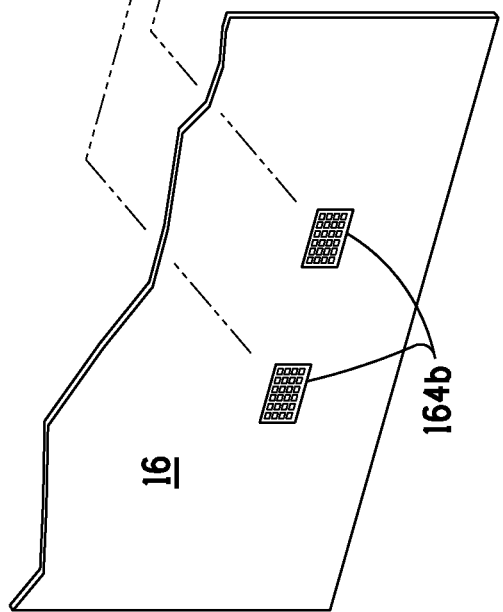

EXPOSURE APPARATUS AND A METHOD FOR CONTROLLING RADIATION FROM A LAMP FOR EXPOSING A PHOTOSENSITIVE ELEMENT

BACKGROUND OF THE INVENTION

1. Field of the Disclosure

This invention pertains to an apparatus and method for preparing a printing plate from a photosensitive element and, in particular, to an apparatus and method for exposing the printing form to actinic radiation.

2. Description of Related Art

Flexographic printing plates are well known for use in relief printing on a variety of substrates such as paper, corrugated board, films, foils and laminates. Flexographic printing plates can be prepared from photosensitive elements containing a layer of a photosensitive composition such as those described in U.S. Pat. Nos. 4,323,637 and 4,427,759. Photosensitive compositions, which may be referred to as photopolymerizable compositions, generally contain an elastomeric binder, at least one monomer, and a photoinitiator. Photosensitive elements generally have the layer of the photopolymerizable composition interposed between a support and a cover sheet or multilayer cover element. Upon imagewise exposure of the photosensitive element to actinic radiation, photopolymerization of the photosensitive composition occurs in the exposed areas, thereby curing and rendering insoluble the exposed areas of the layer. The exposed element can be treated with a suitable solution or treated thermally to remove areas of the photopolymerizable layer that were not exposed which provides a printing relief suitable for use in flexographic printing.

Most commercial flat-bed exposure apparatuses include at least one bank of tubular lamps, which is formed from a plurality of light tubes that are arrayed to form a wall-like effect. The tubular lights are typically fluorescent lamps that emit ultraviolet radiation at or in the range of wavelengths necessary to cause photochemical reaction of the exposed portions of the photosensitive element. A plurality of light tubes is necessary in order to achieve the actinic radiation energy necessary for photopolymerization of the photosensitive element to occur. Some other commercial flat-bed exposure apparatuses include two banks of tubular lamps. At least for exposure of the photosensitive element, the two banks of light tubes are spaced apart, opposite and parallel the other, and the element which is supported on a glass bed is located between the banks. In some cases, the position of one or both banks of tubes may be adjusted to create an appropriate space between the banks to accommodate exposing photosensitive elements. In other cases, an upper bank of light tubes is used for imagewise exposure and/or back exposure of the photosensitive element; and, a lower bank of light tubes is used for light-finishing exposure and post exposure of the relief formed printing plate through the glass bed. In some instances the light-finishing and post exposures are conducted as one step.

In most commercial flat-bed exposure apparatuses the photosensitive element is supported on the glass bed that is surrounded by ports, which in combination with a transparent membrane or coversheet that covers the photosensitive element and a negative film or phototool, draws a vacuum to bring the negative film in intimate contact with the photosensitive element prior to imagewise exposure. Imagewise exposure through a negative film or phototool having image-bearing art-work that is held in intimate contact under vacuum to the photopolymerizable layer of the photosensitive element is often referred to as analog workflow. Analog workflow requires the preparation of the phototool, which is a complicated, costly and time-consuming process requiring separate processing equipment and chemical development solutions. In addition, the phototool may change slightly in dimension due to changes in temperature and humidity, and when used at different times or in different environments, may give different results, which can ultimately result in the mis-registration of multicolor images during printing. Use of a phototool also requires special care and handling when fabricating flexographic printing forms to ensure intimate contact is maintained between the phototool and photosensitive element. In particular, care is required in the placement of both the phototool and the photosensitive element in the exposure apparatus along with special materials, e.g., bleeder strips, to minimize air entrapment during creation of a vacuum to ensure intimate contact. Additionally care must be taken to ensure all surfaces of the photosensitive element, the phototool, and the transparent membrane, are clean and free of dust and dirt. Presence of such foreign matter can cause lack of intimate contact between the phototool and the photosensitive element as well as image artifacts.

Alternatively, imagewise exposure can be through an in-situ mask having radiation opaque areas and transparent areas that had been previously formed above the photopolymerizable layer, so called digital workflow. In most instances of digital workflow, the in-situ mask is formed from a radiation-opaque layer that is integral with the photosensitive element, and thus there is no need to draw vacuum to assure contact of the in-situ mask with the element prior to imagewise exposure. The photosensitive element can be imagewise exposed in the presence of atmospheric oxygen for conventional digital workflow as described in U.S. Pat. No. 5,262,275; U.S. Pat. No. 5,719,009; U.S. Pat. No. 5,607,814; U.S. Pat. No. 6,238,837; U.S. Pat. No. 6,558,876; U.S. Pat. No. 6,929,898; U.S. Pat. No. 6,673,509; U.S. Pat. No. 6,037,102; and U.S. Pat. No. 6,284,431. Alternatively, the photosensitive element can be imagewise exposed in an environment having an inert gas and a controlled amount of oxygen that is less than atmospheric oxygen for modified digital workflow, by placing the photosensitive element in an exposure enclosure or chamber of an exposure apparatus as described, for example, in U.S. Pat. No. 8,241,835. In one embodiment, the enclosure can be sealed from external environment (room conditions) and includes an inlet port for introducing the inert gas and optionally additional oxygen into the enclosure and an outlet port for purging the air that is initially in the enclosure. The conventional digital workflow and the modified digital workflow each provide particular relief structure in the resulting printing form that has specific characteristics and qualities to print desired quality images and graphic information for certain end-use applications. Another digital workflow method disclosed by Zwadlo in U.S. Pat. No. 7,279,254, includes forming a mask digitally in a thermal imaging layer of a separate film, laminating the film with the mask to the photosensitive element, and imagewise exposing the photosensitive element through the laminated mask film. As such, digital workflow because of its ease of use and desirable print performance has gained wide acceptance as a desired method by which to produce a flexographic printing form from the photosensitive element.

However with ever increasing demands on quality, the current state-of-the-art flexographic printing forms may not perform as desired and have trouble meeting the ever increasing demands on quality. Exposure times vary from a few seconds to a several minutes depending upon the output of the lamps, distance from the lamps, desired relief depth, and the thickness of the photosensitive element. Since the photosensitive element is exposed to actinic radiation at three different steps in its conversion to a relief printing form, which includes a back exposure through the support, and imagewise exposure through the mask, and a post-exposure and finishing exposure, it is particularly desirable to create and maintain uniform conditions in the exposure apparatus so that the photosensitive element experiences consistent environment and uniform distribution of actinic radiation during each of these exposures. If the actinic radiation energy impinging the photosensitive element is too low, polymerization reaction may not start at all or may not occur deep enough in the layer of the photosensitive material which impacts the shape of small raised printing elements of the relief image. If the actinic radiation energy impinging the photosensitive element is too high such that the exposure time becomes very short, the shape of the raised printing elements is also poor. The raised printing elements have a shoulder, which is a portion of the raised printing element that transitions from a flat printing area to a sidewall, which becomes too steep, and small dots or lines do not have sufficient base and can easily chip away during printing.

Typically exposure apparatuses include a plurality of lamp tubes in order to achieve the actinic radiation energy necessary for photopolymerization of the photosensitive element to occur. During exposure the plurality of lamps is often in very close proximity to the photosensitive precursor. Due to the number and proximity of the lamps to the photosensitive element, and duration of the exposure, the temperature of the photosensitive element during exposure can change, i.e., increase, during exposure. It is also desirable to maintain the temperature constant on the photosensitive element, and avoid relatively hot or cool regions of the photosensitive element. Temperature changes of the photosensitive element, particularly during imagewise exposure, can influence the effect of oxygen inhibition and the rate of the photochemical reaction/s that occur, and therefore can impact the formation of raised features, particularly the fine highlight dots, of the relief structure of the resulting printing form. A photosensitive element is exposed in many prior art exposure apparatuses in which the precursor is at an ambient temperature at the start and the precursor is at a temperature above ambient at the end of the exposure. Some exposure apparatuses counter the possible temperature increase of the photosensitive element by cooling the exposure bed on which the photosensitive element rests. Some examples of commercial flat-bed exposure devices having an exposure bed that is cooled are CYREL® 1000ECLF, 1000ECDLF, DF1000ECLF, and DF2000EC sold by DuPont (Wilmington, Del., USA); Concept 302ec, 302eclf, 302ecdlf, 305edlf, 400ec, 400eclf, and 501ec sold by Glunz & Jensen (Ringsted, Denmark); and, Nyloflex Next Exposure FII, Next Exposure FV, Exposure unit FIII, Exposure unit FIV, Exposure unit FV, and Combi FIII sold by Flint (Luxembourg, Luxembourg). But even with the photosensitive element supported on a cooled exposure bed, the photosensitive element will still experience temperature changes during exposure. At the start of exposure the bed will be cool and the plurality of lamps will not have had sufficient time to warm the photosensitive element; and as the exposure progresses, the lamps will warm the photosensitive element but the cooled bed will mitigate significant increase in the temperature of the photosensitive element.

Problems can also arise with the quality and uniformity of the radiation emitting from each of the lamps and thus impinging the photosensitive element for a single exposure, as well as for one exposure of a photosensitive element to another exposure of a different photosensitive element, i.e., for exposures of multiple photosensitive elements over a period of time, particularly over the lifetime of the lamps. During exposure, the radiation impinging the photosensitive element should be evenly distributed over the area of the exposure bed, so that the entire exposed surface of the photosensitive element is uniformly irradiated. The plurality of light tubes when energized typically generates heat, which particularly in an enclosed environment interior to the exposure apparatus can influence the temperature of the lamps. So much heat may be generated by the lamps that the lamps overheat, and it can become difficult to maintain the lamps at a constant temperature or within a desired temperature range. It is desirable to maintain the temperature constant from lamp to lamp within the plurality of light tubes, as well as along the axial length of each of the lamps, and avoid relatively hot or cool regions in the lamps and from lamp to lamp. Barral et al. in U.S. Pat. No. 5,983,800 describe a machine for insolating photopolymer plates to ultraviolet light that delivers a flow of cooling air to the machine top in the vicinity of a negative, the photopolymer plate and a transparent membrane used to draw vacuum; and includes a bank of fans or blowers to provide some cooling of the bank of ultraviolet lamps. However, not all lamps of the bank of lamps are equally cooled by merely blowing air across the lamps to cool the lamps since relatively hot or cool regions can occur in the lamps and from lamp to lamp. Non-uniform lamp temperatures will generate non-uniformity in the irradiance of the radiation emitting from the lamps and thus impinging the photosensitive element.

Another problem is that lamps age with use, i.e., the irradiance emitted by a lamp or its intensity diminishes as the lamp is used. An integrator can be used to compensate for lamp aging to a certain degree, but either the exposures become too long or is insufficient to provide desired degree of photochemical reaction in the photosensitive element. Exposure apparatuses for photosensitive elements are known to have a radiation integration system, sometimes referred to as an integrator, which evaluates the intensity of the lamps illuminating the exposure bed where the printing form lies. An example of an exposure unit having an integrator is the CYREL® 1000ECLF. The integration system compensates the time of exposure according to the intensity of the radiation emitted by the lamps. The system may include a photocell that senses the radiation incident thereon, and a circuit that integrates a signal from the photocell. The photocell in these exposure units typically measures the intensity of the lamps for a broad spectrum of wavelengths of the emitted radiation. Such exposure control systems, should in theory provide the designed for exposure values. In practice however, since exposure is a function of many variable factors, there is potential for the exposure values actually produced by any such system to vary from the values designed for. Ultimately the integration of the lamp energy is not sufficient and all the lamps will need to be removed and replaced with new lamps. Even when the lamp or lamps are replaced, the light intensity drops off in the first 20 hours of lamp life, so that recalibration is necessary throughout this initial age-in of the lamps. Factors which affect the replacement of lamps are the physical location of the lamps within the hood, their elapsed operation time, and the elapsed operation time of all adjacent lamps. Frequent recalibration due to lamp replacement is an undesired step that can consume considerable platemaking time and manpower, as well as printing forms. Due to the problems and costs associate with lamp changes it is desirable to extend the life of the lamps without sacrificing uniformity and consistency in irradiation emitted by the lamps during exposure.

Therefore, there is a need to overcome the problems of related art and to provide an improved exposure apparatus and method for preparing relief printing forms from photosensitive elements using the exposure apparatus. It is desirable to insure proper exposure of photosensitive elements consistently over the useful life of the lamp/s in an exposure unit. It is also desirable to avoid the time, manpower, and materials associated with lamp replacement and recalibration of exposure unit to determine appropriate exposure for photosensitive elements. It is also desirable to extend the lifetime of the lamps without sacrificing the quality and uniformity of the exposure radiation. It is also desirable to insure proper exposure of photosensitive elements necessary to achieve satisfactory resulting relief structures for printing forms. There is a need to establish and maintain conditions in an exposure apparatus that can provide sufficiently consistent quality and uniformity of actinic radiation impinging photosensitive elements.

SUMMARY

In accordance with the present invention there is provided an exposure apparatus for exposing a photosensitive element to actinic radiation, comprising: an exposure bed for supporting the photosensitive element; a lamp assembly disposed adjacent the exposure bed comprising at least two lamps that are adjacent to each other to expose the photosensitive element with the actinic radiation at a target irradiance, and an adjustable ballast connected to at least one lamp of the at least two lamps to adjust power received by the one lamp; a sensor disposed adjacent at least one lamp of the at least two lamps for measuring irradiance impinging the exposure bed; and, a controller that adjusts the power to the adjustable ballast based upon comparison of the measured irradiance to the target irradiance to adjust the irradiance emitted from the at least one lamp to match the target irradiance.

In accordance with another aspect of the present invention there is provided a method for controlling radiation emitting from a lamp in an exposure apparatus for exposing a photosensitive element to the radiation, comprising: a) irradiating an exposure bed with radiation at a target irradiance using a lamp assembly comprising at least two tubular lamps that are adjacent to each other, and an adjustable ballast connected to at least one lamp of the at least two lamps wherein the ballast adjusts power received by the one lamp; b) measuring irradiance emitting from the at least one lamp in proximity of the exposure bed; and c) adjusting the power to the ballast of one lamp based on comparison of the measured irradiance to the target irradiance to adjust the irradiance emitted from the at least one lamp to match the target irradiance.

In accordance with another aspect of the present invention there is provided a method for preparing a relief printing form from a photosensitive element having a layer of a photopolymerizable composition comprising: controlling radiation emitting from a lamp in an exposure apparatus according the above method, such that the irradiance emitted from the at least two lamps is at the target irradiance; imagewise exposing the photosensitive element through a mask to the radiation emitting at the target irradiance, forming at least a cured portion and at least a uncured portion of the layer; and treating the exposed element to remove the uncured portions thereby forming a relief structure suitable for printing.

BRIEF DESCRIPTION OF THE DRAWINGS

FIG. 6A is a schematic backside view of one embodiment of the exposure apparatus of FIG. 2B with most of the housing covers removed, and with a back ventilation panel of the upright housing is exploded away showing the carriage assembly as a means for moving the lamp housing assembly from the first position to the second position wherein the lamp housing assembly is in the first position, and showing a means for pressurizing the air chamber of the lamp housing assembly that includes two blowers each having intake ducts.

FIG. 6B is a schematic backside view of one embodiment of the exposure apparatus of FIG. 2B with most of the housing covers removed, wherein the lamp housing assembly is in the second position, showing the carriage assembly as means for moving the lamp housing assembly from the first position to the second position, and showing each of the intake ducts of the two blowers mating with a filter for incoming air during exposure.

DESCRIPTION OF THE PREFERRED EMBODIMENTS

Figure 1:
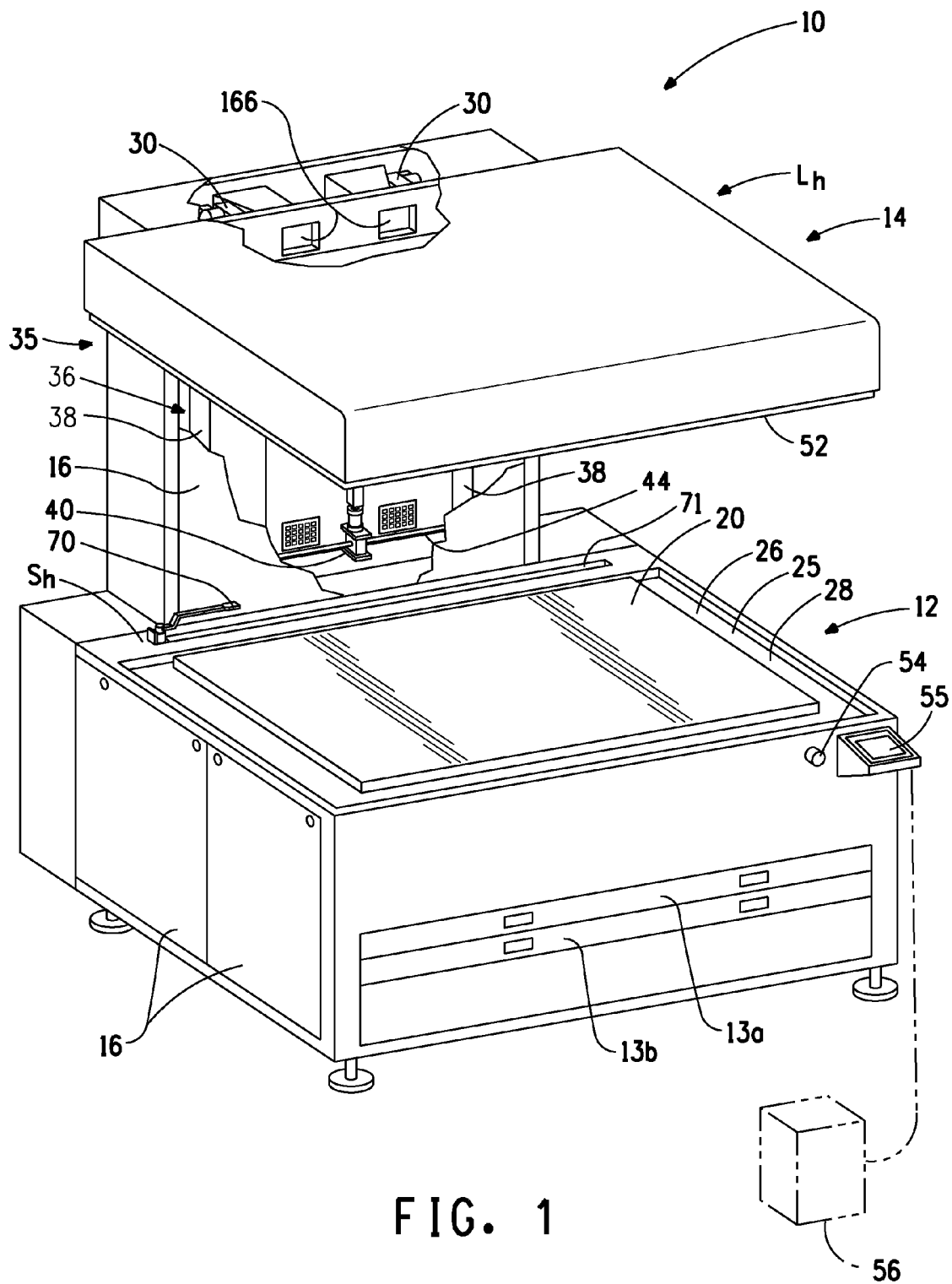
FIG. 1 is a schematic perspective view of one embodiment of an apparatus for exposing a photosensitive element according to the present invention, showing a lamp housing assembly and a base assembly having an exposure bed for supporting a photosensitive element having planar or plate-like shape, and showing an upright housing with a portion of a cover panel cutaway to show some of a carriage assembly that moves the lamp housing assembly.

Throughout the following detailed description, similar reference characters refer to similar elements in all figures of the drawings.

The present invention provides an apparatus and method for exposing a photosensitive element to radiation, i.e., actinic radiation. The apparatus may also be referred to herein as a bed exposure unit, a flat-bed exposure unit, or an exposure apparatus. The present exposure apparatus and method may be used for imagewise exposure, blanket or overall exposure, overall exposure through the back side to form a floor, post-exposure, and/or light-finishing exposure of the photosensitive element. In most embodiments, the present exposure apparatus and method is used for imagewise exposure of the photosensitive element. Although in some embodiments the present apparatus and method is described in reference to a particular embodiment in which the photosensitive element is planar or plate-shaped element, the invention is not so limited and is also contemplated for use in exposure apparatuses that accommodate cylindrically-shaped photosensitive elements.

The present invention provides at least three novel and unobvious embodiments of an exposure apparatus for exposing a photosensitive element to radiation. The present invention also provides at least three novel and unobvious embodiments of a method for exposing a photosensitive element to radiation. The present invention further provides one or more novel and unobvious embodiments of a method for controlling radiation emitting from a lamp in an exposure apparatus for exposing a photosensitive element to the radiation. Specific embodiments of the present invention of an exposure apparatus and method for exposing include, but are not limited to, the following.

Embodiment One

An exposure apparatus includes, but is not limited to, an exposure bed having at least one orifice that is connected to a means for removing air between the photosensitive element and an exterior surface of the exposure bed; an assembly for controlling temperature of the bed to allow for heating and cooling of the bed; and, a lamp assembly having at least one lamp positioned to irradiate the photosensitive element.

Embodiment Two

A method includes, but is not limited to, the steps of supporting the photosensitive element on an exposure bed having at least one orifice from an exterior surface of the bed; removing air between the photosensitive element and the exterior surface through the at least one orifice; determining a temperature of the bed; and controlling the temperature of the bed to a target temperature by transporting a temperature-controlled fluid adjacent a surface of the bed opposite the exterior surface, and heating or cooling the fluid.

Embodiment Three

An exposure apparatus includes, but is not limited to, a lamp assembly including at least two lamps each having a tubular length and a backside, the at least two lamps are adjacent to each other to irradiate the photosensitive element with radiation; an air distribution assembly including an air chamber disposed adjacent to the backside of the at least two lamps and having one or more openings that are aligned parallel to the tubular length of the backside for each of the at least two lamps, wherein the chamber is pressurized to provide the same or substantially the same volumetric rate of the air exiting each opening and impinging the backside of each of the lamps; a controller connected to the at least one blower to adjust the volumetric rate of the air impinging the at least two lamps, and a sensor that is selected from either or both; a sensor for measuring a temperature of at least one of the lamps, wherein the volumetric rate of the air is adjusted based on comparison of the measured temperature to a target temperature; or, a sensor for measuring irradiance emitting from at least one of the lamps, wherein the volumetric rate of the air is adjusted based on comparison of the measured irradiance to a target irradiance.

Embodiment Four. The method includes, but is not limited to, the steps of irradiating the photosensitive element with radiation from at least two lamps adjacent to each other, each lamp having a tubular length and a backside; impinging air on the backside of each of the at least two lamps at a volumetric rate from an air chamber that is adjacent the backside of the at least two lamps and has one or more openings that are aligned parallel to the tubular length for each of the at least two lamps, wherein the air in the chamber is pressurized to uniformly distribute the air exiting each of the one or more openings; controlling the volumetric rate of the air impinging the at least two lamps by selecting from measuring a temperature of at least one of the lamps, and adjusting volumetric rate of air exiting the one or more openings based on the measured temperature relative to a target temperature; or, measuring irradiance of at least one of the lamps, and adjusting the volumetric rate of the air exiting the one or more openings based on the measured irradiance relative to a target irradiance; or measuring both a temperature of at least one of the lamps and irradiance of at least one of the lamps, which can be the same or different, and adjusting volumetric rate of air exiting the one or more openings based on the measured temperature relative to a target temperature and based on the measured irradiance relative to a target irradiance.

Embodiment Five

An exposure apparatus includes, but is not limited to, an exposure bed; a lamp assembly disposed adjacent the exposure bed that includes at least two lamps that are adjacent to each other to irradiate the bed with the radiation; and an adjustable ballast connected to at least one lamp of the at least two lamps to adjust power received by the one lamp; a sensor disposed adjacent at least one lamp of the at least two lamps for measuring irradiance; a controller that adjusts the power to the adjustable ballast which adjusts the irradiance emitted from the at least one lamp to match the target irradiance.

Embodiment Six

A method includes, but is not limited to, the steps of irradiating an exposure bed with radiation using a lamp assembly that includes at least two tubular lamps that are adjacent each other, and an adjustable ballast connected to at least one lamp of the at least two lamps wherein the ballast adjusts power received by the one lamp; measuring irradiance from the one lamp of the at least two lamps in proximity of the exposure bed; and adjusting the power to the ballast of one lamp based on comparison of the measured irradiance to a target irradiance to adjust the irradiance emitted from the at least one lamp to match the target irradiance.

Any of the above Embodiments One through Six can be combined with one or more of the other Embodiments, so long as they are not mutually exclusive. The skilled person would understand which embodiments were mutually exclusive and would thus readily be able to determine the combinations of embodiments that are contemplated by the present application.

"Actinic radiation" refers to radiation capable of initiating reaction or reactions to change the physical or chemical characteristics of a photosensitive composition. Actinic radiation can include ultraviolet radiation, visible light, and e-beam radiation. In one embodiment, actinic radiation refers to radiation having wavelengths in the ultraviolet region. In another embodiment, actinic radiation refers to radiation having wavelengths in the visible region. In another embodiment, actinic radiation refers to radiation having wavelengths in the ultraviolet and visible regions. Examples of ultraviolet radiation as actinic radiation include, but is not limited to, UV-A radiation, which falls within the wavelength range of from 320 nanometers (nm) to 400 nm; UV-B radiation, which is radiation having a wavelength falling in the range of from 280 nm to 320 nm; UV-C radiation, which is radiation having a wavelength falling in the range of from 100 nm to 280 nm; and UV-V radiation, which is radiation having a wavelength falling in the range of from 400 nm to 800 nm.

"Absorption peak" or "peak activating radiation" refers to a wavelength or frequency at which a material absorbs the most power whenever the material is bombarded with light waves. "Absorption spectrum" refers to an array of absorption lines and absorption bands that results from the passage of radiant energy from a continuous source through an absorbing medium.

"Emission peak" or "peak emission" refers to a wavelength or frequency at which a source of radiation emits the most power.

"Emission spectrum" refers to electromagnetic spectrum produced when radiations from any emitting source, excited by any of various forms of energy are dispersed.

"Irradiance" refers to the power of electromagnetic radiation per unit area incident on a surface, and is expressed in Watts/meter$^2$, or mWatts/cm$^2$. In particular for the present invention, the electromagnetic radiation is the radiation capable of initiating reaction or reactions to change physical or chemical characteristics, i.e., actinic radiation, per unit area incident on the photosensitive element. Irradiance may also be referred to herein as intensity of the radiation.

The term "room temperature" or, equivalently "ambient temperature," has its ordinary meaning as known to those skilled in the art and typically includes temperatures within the range of about 16° C. (60° F.) to about 32° C. (90° F.).

The photosensitive element includes a composition layer that may be in an uncured state, a cured state, or in a partially cured state. In some embodiments, the photosensitive element includes a layer of a composition that is responsive to actinic radiation, i.e., photosensitive, and thus the composition layer of the photosensitive element is uncured or not crosslinked, prior to exposure by the present invention. In most embodiments, the photosensitive element includes a mask on or adjacent to its exterior surface for exposure of the photosensitive composition layer to be an imagewise exposure. The mask may be formed by any method conventional to those skilled in the art. In other embodiments, the photosensitive element may be blanket exposed in the present apparatus to overall cure or crosslink the photosensitive composition layer. The overall cured photosensitive element may be subsequently engraved to form a relief surface suitable for printing. In other embodiments, a relief surface on the photosensitive element may be exposed in the present apparatus to light-finish or detackify the relief surface formed from a layer of a photosensitive composition that was exposed to actinic radiation and thus cured, i.e., photohardened or crosslinked. In yet other embodiments, the photosensitive element includes a relief surface formed from a layer of a composition that was exposed to actinic radiation and is substantially cured, but is still responsive to actinic radiation, and thus may be exposed to actinic radiation by the present apparatus to complete curing, i.e., crosslinking, of the relief surface, which may be referred to as post-exposure. The photosensitive element may also be referred to herein as a photopolymerizable element, a photosensitive precursor, a print precursor, or a precursor.

Exposure Apparatus

FIG. 1 shows one embodiment of an exposure apparatus 10 for exposing a precursor 20 in accordance with the invention that includes a base assembly 12, and a lamp housing assembly 14. The base assembly 12 and the lamp housing assembly 14 each include multiple cover panels 16 that connect to a frame or frames to enclose the operational features of the exposure apparatus 10. The base assembly 12 includes an exposure bed 25 having a first side 26 with an exterior surface 28 for supporting the photosensitive element or precursor 20. In most embodiments the precursor 20 is centered or centrally located on the exposure bed 25. The lamp housing assembly 14 includes at least one blower 30, and at least one lamp 32 in some embodiments of the apparatus 10, or at least two lamps 32 in other embodiments of the apparatus 10, for exposing the precursor 20 to actinic radiation at an exposure location. The present exposure apparatus 10 and method is useful and provides particular advantages for conventional digital workflow in which the precursor includes an in-situ mask and is imagewise exposed through the in-situ mask in the presence of atmospheric oxygen.

The present exposure apparatus 10 and methods can also be useful for modified digital workflow and analog workflow, provided that the necessary features for each of these workflows are incorporated into the apparatus. The exposure apparatus 10 includes as an embodiment one or more of the following features that are described herein, alone or in any combination, a temperature-controlled exposure bed; and/or, a lamp assembly having an air distribution assembly for controlling temperature and/or irradiance of at least one lamp; and/or, lamp assembly including an adjustable ballast coupled to one or more lamps that adjusts the power received by the lamp or lamps, for exposing the precursor to actinic radiation. In most embodiments, the exposure apparatus 10 includes all of these features for exposing the precursor to actinic radiation, such as ultraviolet radiation, through a mask, i.e., imagewise exposure. In other embodiments, the exposure apparatus 10 includes one or a combination of two of these features. Optionally, the exposure apparatus capable of imagewise exposure with one or more of the features can include an additional exposure station that accommodates light-finishing and/or post-exposure. In the embodiment shown in FIG. 1, the base assembly 12 includes two drawers 13a, 13b to accommodate the optional exposure for light-finishing exposure and/or post-exposure of the precursor, in which one drawer 13a includes lamps (not shown) that emit UV-C and/or lamps (not shown) that emit UV-A radiation, and the second drawer 13b holds the precursor for exposure/s. For simplicity, the details and the interiors of drawers of the additional exposure station are not shown. The base assembly 12 and the lamp housing assembly 14 is described in greater detail below.

In the embodiment shown in FIG. 1, between a back side of base assembly 12 and a back side of the lamp housing assembly 14 is a upright housing 35 having a carriage assembly 36 that supports the lamp housing assembly 14 in a cantilevered manner above the base assembly 12, and moves the lamp housing assembly 14 to and from at least two locations. This embodiment of the exposure apparatus 10 may be referred to as a top-lift exposure apparatus. In FIG. 1 a portion of a cover panel 16 of the upright housing 35 is removed to show the carriage assembly 36 that includes two upright members 38, which are orthogonal to the base and lamp housing assemblies 12,14, and a means for moving the lamp housing assembly 40 on the upright members 38. At a top of the upright housing 35 and at the back side of the lamp housing assembly 14 are linear bearings each of which engage with one of the upright members 38 so as to slide or move along the upright member.

Figure 2A:
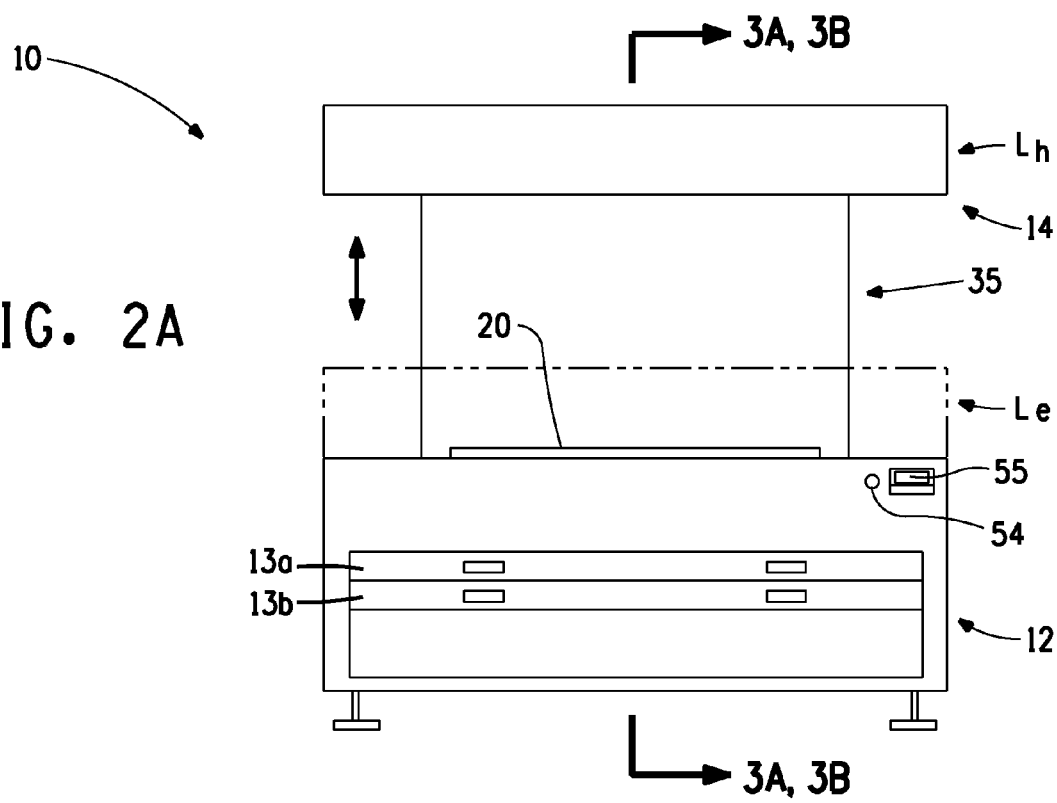
FIG. 2A is a schematic front view of one embodiment of the exposure apparatus shown in FIG. 1, showing that the lamp housing assembly is movable from a first or upper location that is positioned at a distance from the base assembly to a second or lowered location (in phantom lines) that is disposed above the photosensitive element on the exposure bed of the base assembly. The second position of the lamp housing assembly may also be referred to as an exposing position or exposure location.
Figure 2B:
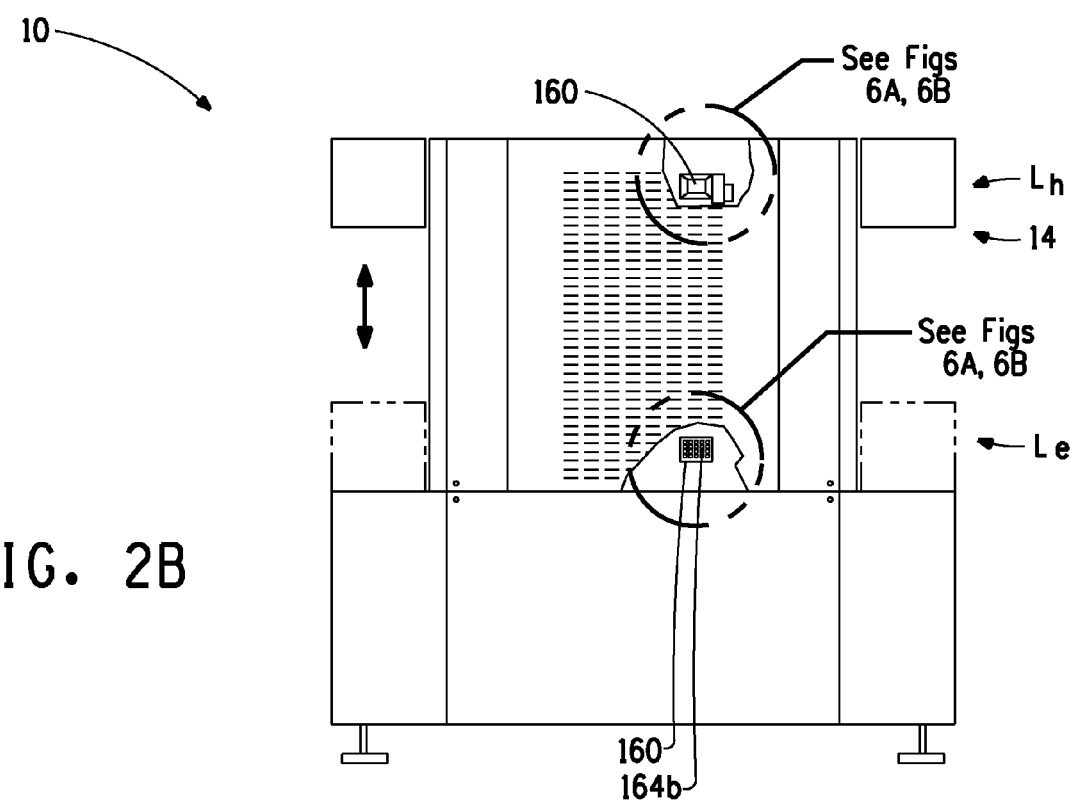
FIG. 2B is a schematic back view of one embodiment of the exposure apparatus shown in FIG. 1, showing the lamp housing assembly in the first position and the second position (in phantom lines).

The carriage assembly 36 including the means for moving 40 the lamp housing assembly 14 is shown in FIG. 1, FIG. 2A, FIG. 2B, FIG. 6A, and FIG. 6B. The means for moving 40 the lamp housing assembly 14 is configured to move the lamp housing assembly which includes a drive motor 41 operating a gear box 42 connected to a rod 44. At each end of the rod 44 is a sprocket wheel 46a that engages with a toothed belt or gear belt 48. A second rod 49 having ends with sprocket wheels 46b, which also engage with the gear belt 48, is mounted at or near a top of the upright housing 35. A linear bearing 50 is mounted for vertical transport on each of the upright members 38. The linear bearing 50 includes a housing that is coupled to the gear belt 48 and that is mounted to the frame of the lamp housing assembly 14. The lamp housing assembly 14 is moved up and down along the upright members 38 by operating the drive motor 42 causing the gear box 42 to rotate the rod 42 with the sprocket wheels 46a engaged in the gear belt 48. Since the gear belt 48 travels about sprocket wheels 46a,46b, and is coupled to the linear bearing 50, the linear bearings 50 are moved along the upright members 38, and thereby transports the lamp housing assembly 14 to and from a first location, Lh and a second location, Le. The first location Lh of the lamp housing assembly 14 is a home location, that is separated from the base assembly 12 as shown in FIG. 1 and FIG. 2A to allow for loading of the precursor 20 on the exposure bed 25. The second location Le of the lamp housing assembly 14 is an exposure location, in which the lamp housing assembly 14 is disposed above, adjacent to and in close proximity to the exposure bed 25 as shown in phantom lines in FIGS. 2A and 2B. In the exposure location Le, the at least one lamp 32 of the lamp housing assembly 14 is parallel to the precursor 20 on the exposure bed 25.

Figure 5:
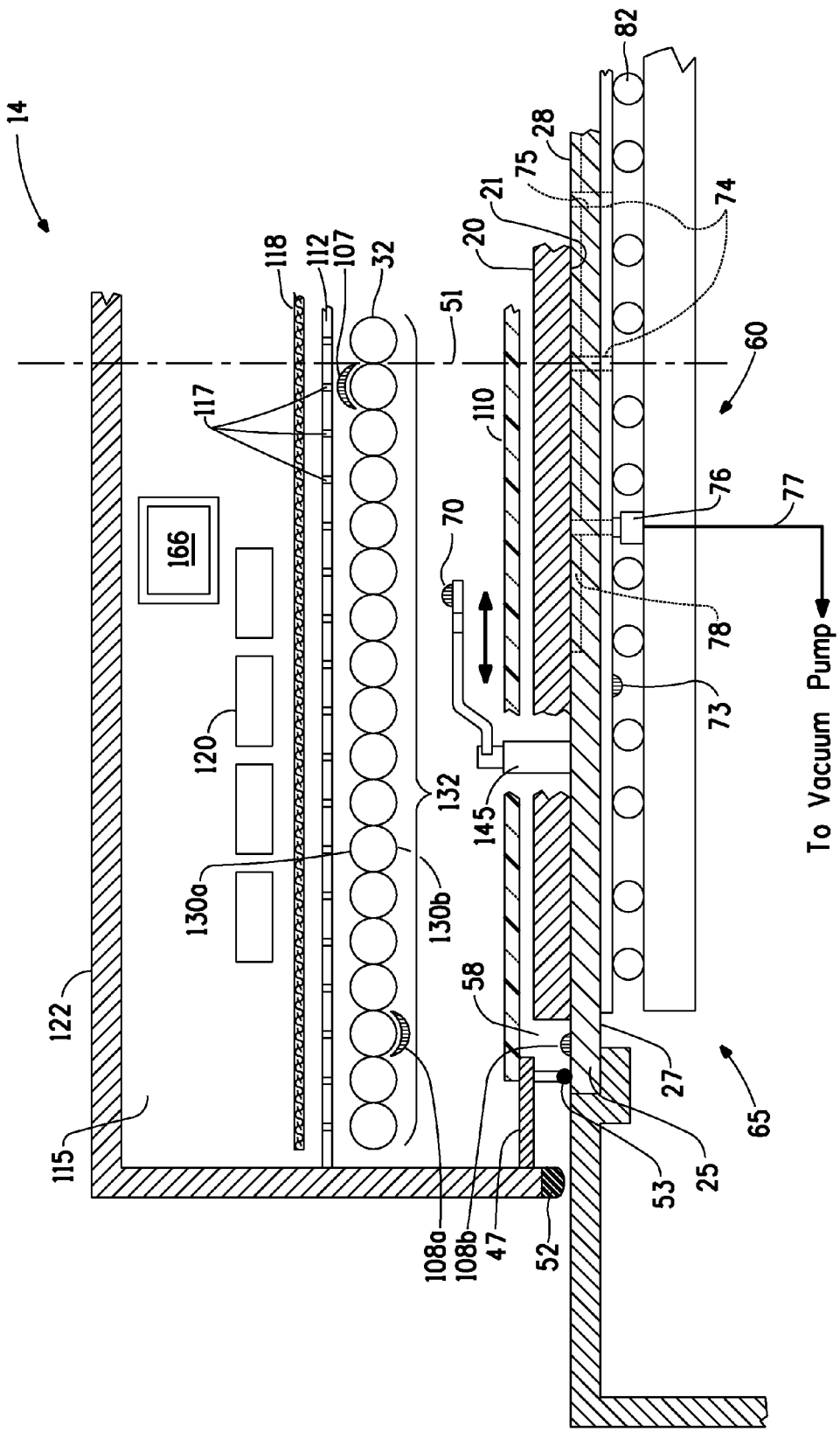
FIG. 5 is a schematic partial cross-sectional front view of a section of the lamp housing assembly and a section of the base assembly taken along line 5-5 of the one embodiment of the exposure apparatus of FIG. 3B, wherein the sections shown are approximately half sections that can be substantially replicated (except for the movable sensor) about the centerline 51 (mixed dashed line) of FIG. 5, that shows the lamp housing assembly in the second position adjacent exposure bed and the means for controlling the temperature of the bed of the base assembly, wherein the photosensitive element is broken apart to show a home position and a home station of the movable irradiance sensor.

FIG. 5 shows the lamp housing assembly 14 in the second position Le adjacent to the exposure bed 25 of the base assembly 12 wherein the sections shown are approximately half sections of the lamp housing assembly and the exposure bed 25 and the assembly 65 for controlling the temperature of the bed that can be substantially replicated (except for the movable sensor 70) about the centerline 51 (mixed dashed line) of FIG. 5. The lamp housing assembly 14 further includes a perimeter safety switch bar 52 that deactivates the movement of the lamp housing assembly 14 should the safety switch bar 52 be contacted or contact an upper surface of the base assembly 12. When in the exposure position, Le, the housing of the lamp housing assembly 14 with the safety switch bar 52 surrounds the exposure bed 25 and encloses the precursor 20. The cover panels of the lamp housing prevent or substantially prevent radiation from escaping during an exposure. In some embodiments, the safety switch bar is a safety rail connected to a switch that stops the travel of the lamp housing assembly 14 toward the base assembly 12.

In some embodiments as shown in FIG. 5, the lamp housing assembly 14 further includes a perimeter seal 53 that has a smaller perimeter than the safety switch bar 52. The perimeter seal 53 with one or more structural elements of the lamp housing assembly 14, such as the optional glass plate 110 that resides on a frame member, and with the upper surface of the base assembly 12 form an enclosure 58 for a modified digital workflow. The workflow for the modified digital exposure creates an environment of an inert gas and a concentration of oxygen of 190,000 to 100 ppm in the enclosure 58 for imagewise exposure of the precursor having an in-situ mask, as disclosed in U.S. Pat. Nos. 8,241,835 and 8,236,479.

The exposure apparatus 10 further includes a main switch 54 and a control panel 55 having a display and a series of selectors for entering information by the operator about the precursor to be exposed, and for monitoring and controlling its operation. The exposure apparatus 10 also includes at least one controller 56 (shown in phantom lines), or a computer and regulator/s, that is electronically coupled to components of the exposure apparatus 10 and with the aid of sensors, monitors certain specific conditions in the exposure apparatus 10, compares each monitored condition to a desired or target value, and then as needed may perform or cause to be performed an action to change the current condition. In most embodiments, the controller 56 is a programmable logic controller, sometimes referred to as PLC or programmable controller, which is a digital computer used for automation, such as control, sequencing, and interlock logic, of the electromechanical devices contained herein. In another embodiment of the exposure apparatus (not shown), the lamp housing assembly can be attached to the base assembly by one or more hinges connecting to a common side of each assembly, which can be referred to as a clamshell exposure unit. For the loading of the precursor on the exposure bed, the lamp housing assembly pivots by the hinge/s and tilts away from the base. For the exposure location, the lamp housing assembly would pivot toward the base, so that the at least one lamp of the lamp housing assembly would be parallel to the precursor on the exposure bed.

Base Assembly

As shown in FIG. 3A, FIG. 3B, FIG. 5, and FIGS. 8-10, the base assembly 12 further includes the exposure bed 25 having the first side 26 and a second side 27 opposite the first side 26, a means 60 for removing air between the precursor and an exterior surface on the first side 26 of the exposure bed 25, and an assembly 65 for controlling temperature of the exposure bed 25 to allow for heating and cooling of the exposure bed, and thereby heating and cooling of the precursor 20.

In the embodiments shown the apparatus 10 accommodates conventional digital workflow, which is conducted in the presence of atmospheric oxygen, as well as modified digital workflow. The exposure bed 25 includes an array of ports 66 to introduce an inert gas, such as nitrogen, and compressed air, in the enclosure 58 and create a desired environment of the inert gas and concentration of oxygen of between 190,000 ppm and 100 ppm, for the modified digital imagewise exposure that is disclosed in U.S. Pat. No. 8,241,835. Although it is preferred that the exposure apparatus 10 includes the ports 66 and gas supplies of nitrogen 68a and compressed air 68b and lines to be able to conduct modified digital imagewise exposures of precursors, this capability is optional and the present inventive exposure apparatus 10 and methods do not rely upon this capability. In some embodiments during imagewise exposure, the gases in the enclosure 58 can leak at the seal 53 and escape to interior of the apparatus 10, which is ultimately vented into the room or outside.

Near the backside of the exposure bed 25 and adjacent to the upright housing 35 is a scanning sensor 70 for determining the irradiance that emits from one or more lamps 32 of the lamp housing assembly 14. As shown in FIG. 1, the scanning sensor 70 is located at its home station Sh. The scanning sensor 70 includes a transport assembly 62 for moving the scanning irradiance sensor 70 from one to two or more positions along a passage that is near the upright housing 35 at the backside of the exposure bed 25. Though physically located with the base assembly 12, the transporting assembly 72 and the scanning irradiance sensor 70 will be further described in relation to the lamp housing assembly 14 and methods of operating the lamps.

In one embodiment of the present exposure apparatus 10 and method of use, it is desirable to maintain the precursor 20 at a constant or substantially constant temperature or within a small range of temperature during exposure, i.e., from start to end of an exposure to the radiation by the lamp 32 or lamps of the lamp assembly 14. The quality of the relief image can be improved by maintaining the temperature of the precursor constant or substantially constant during exposure, i.e., from the start until the end of the irradiance by the lamp or lamps. In most embodiments the temperature of the precursor 20 during exposure is maintained at a target temperature less than about 35° C. In some embodiments the precursor 20 is maintained at a target temperature between and optionally including any two of the following values 20, 21, 22, 23, 24, 25, 26, 27, 28, 29, 30, 31, 32, 33, 34, and 35° C. In some other embodiments during exposure the precursor 20 is maintained constant or substantially constant in a small temperature range that is ±3° C. from a temperature selected from 20 to 35° C. In most embodiments, the precursor 20 is allowed to equilibrate to the target temperature before exposure begins, and then is maintained at the target temperature, or within the target temperature range, during the exposure, and to completion of the exposure.

The exposure bed 25 is made of metal since its thermal conductivity allows the exposure bed to quickly respond to adjustments by the temperature-controlling assembly 65 to maintain the temperature of the bed at the target temperature or in the target temperature range, so that the precursor 20 is maintained at its target temperature. In some embodiments, the exposure bed 25 is made of aluminum. In some other embodiments, the exposure bed 25 is made of aluminum that is embedded with copper plate/s. The temperature controlling assembly 65 for the exposure bed 25 that allows for heating and cooling of the exposure bed, in combination with the means 60 for removing air from between the precursor 20 and the exterior surface 28 of the exposure bed that brings the precursor into intimate contact with the exterior surface, establishes the precursor at a target temperature or in a temperature range prior to exposure and maintains the precursor at a target temperature or in a target temperature range during exposure. In embodiments in which the exposure apparatus 10 is used for imagewise exposure of the precursor 20, the back side 21 or side with the support for the photosensitive precursor contacts the exterior surface 28 of the bed. The capability to have the precursor 20 in intimate contact with the exposure bed 25 that can be heated and cooled allows for the temperature of the precursor to be maintained regardless of the ambient conditions and counters the warming effect by the lamp or lamps on the precursor. This capability also allows for adjusting or optimizing the target temperature of the exposure bed 25 according to the particular type of precursor that is being exposed, i.e., precursors having different photosensitive compositions, and/or additional layers, and/or for treatment by heat or solution.

In some embodiments, the temperature of the precursor 20 can be taken at one or more locations on the precursor and can be measured by one or more infrared sensors (not shown). In most embodiments, the temperature of the precursor 20 is not directly measured, but the temperature of the exposure bed 25 is measured with a sensor 73, to thereby maintain the precursor at the desired temperature. The temperature of the exposure bed 25 is established prior to exposure and during exposure is maintained at a target temperature less than about 38° C., and typically is established and maintained at a target temperature or in a target temperature range between 20 to 35° C. In some embodiments, the exposure bed 25 is established and maintained at a target temperature between and optionally including any two of the following values 20, 21, 22, 23, 24, 25, 26, 27, 28, 29, 30, 31, 32, 33, 34, 35, 36, 37, and 38° C. In some other embodiments, the exposure bed 25 is maintained constant or substantially constant in a target temperature range that is ±2° C. from a temperature selected from 24 to 31° C. In one embodiment, the measured temperature of the exposure bed 25 is offset from the actual temperature of the precursor 20. However, through testing the offset between the two temperatures, i.e., temperature of the exposure bed and the temperature of the precursor, is known and compensated for by setting the target temperature of the exposure bed 25 to provide the desired target temperature for the precursor 20 for and during exposure. In some embodiments, the temperature of the precursor 20 when positioned on the exposure bed 25 readily equilibrates to the target temperature of the exposure bed. This can occur when the precursor 20 is stored at room temperature and/or when the precursor has a thickness (i.e., of the photopolymer layer and the support) that is relatively thin, i.e., typically less than 112 mils (0.28 cm).

The exterior surface 28 of the exposure bed 25 includes at least one orifice 74 that is connected to the means 60 for removing air between the precursor 20 and the exterior surface, such as a vacuum source. The at least one orifice 74 is centrally located on the exposure bed 25, so that precursors of any size, i.e., planar area, when located on the exposure bed covers all of the one or more orifices 74. The number of orifices 74 is not particularly limited providing that the air between the precursor 20 and the exterior surface 28 of the exposure bed 25 can be sufficiently removed to provide uniform or substantially uniform contact of the precursor to the exterior surface, and does not trap pockets of air between the precursor and the exterior surface. Too few of orifices may require excessive vacuum to remove the air, and/or may draw the precursor 20 into the orifice 74 which can result in artifact/s being formed in the precursor or artifact that appear after additional preparation steps to convert the precursor into a printing form. Too many orifices can affect the ability of the exposure bed 25 to maintain its temperature and/or disrupt its substantially uniform exterior surface that supports and contacts the precursor 20, and as such it may be difficult to maintain the temperature of the precursor substantially constant during exposure. In one embodiment, the exposure bed 25 includes four orifices 74 that are uniformly and geometrically spaced apart and centrally located on the exterior surface 28. Two or more orifices 74 do not necessarily need to be geometrically or uniformly spaced apart provided that the air can be uniformly removed without trapping air between the precursor 20 and the exterior surface 28. In most embodiments, the at least one orifice 74 forms an air passage 75 from the first side 26 to the second side 27 of the exposure bed 25; and a coupling 76 is located at an end of the passage 75 on the second side 27 of the bed, which connects the orifice 74 via an air conduit 77 or tubing to the vacuum source 79 as the means 60 for removing air from between the precursor and the bed 25. The means 60 for removing air between the precursor 20 and the exterior surface 28 is a source for creating a vacuum or negative pressure, which in most embodiments is a vacuum pump. It is well within the skill of one in the art to contemplate alternate embodiments of the means 60 for removing air that can be configured to remove air between the precursor 20 and the exposure bed 25, such as for example, a blower operating to provide a negative pressure, or a venturi, or a house vacuum for various operations conducted at a site or facility.

Optionally, in one embodiment the first side 26 of the exposure bed 25 includes one or more channels 78 that connect to at least one of the orifices 74. The one or more channels 78 are grooves into the exterior surface 28 of the bed 25 that form pathways to direct air to the one or more orifices 74 and facilitate the removal of air from between the precursor 20 and the exterior surface 28. Each of the one or more channels 78 has a depth and a width at the exterior surface 28 of the bed 25. The channel depth is not particularly limited, though in most embodiments the channel 78 can have a depth of 0.5 to 1.1 mm. The channel width should not be so wide that the precursor 20 is pulled into the channel 78 when the air is removed between the precursor and the exterior surface 28 by the vacuum source 60 as this can form artifacts in the precursor. The channel 78 has a width that is between and optionally including any two of the following values 0.5, 0.6, 0.7, 0.8, 0.9, 1.0, 1.1, 1.2, 1.3, 1.4, and 1.5 mm. In some embodiments, the width of the channel 79 is 1.0 to 1.4 mm. If more than one channel 78 is present, the width and depth of each channel can be different. In another embodiment, optionally the exterior surface 28 of the exposure bed 25 can be textured or roughened to aid in removing air or eliminate entrapping air between the precursor 20 and the exterior surface. In some embodiments, the exterior surface 28 can include both the channels 28 and the textured surface. For small precursors having for example a size less than 220 mm by 250 mm, one orifice 74 can be sufficient to remove air between the precursor 20 and the exterior surface 28. For large precursors having for example, a maximum size of 1067 mm by 1524 mm, four orifices 74 in combination with a plurality of connecting channels 78 may be sufficient to remove air between the precursor 20 and the exterior surface 28.

When the precursor 20 is located on the exposure bed 25 for an exposure, the one or more orifices 74, and optional channels 78, are covered by the precursor. It should be noted that in the present invention the one or more orifices 74 used to remove air and assure intimate contact between the precursor 20 and the exterior surface 28, are not intended for use in analog workflow in which a negative is brought into intimate contact to a side of the precursor 20 opposite the support side 21 with a transparent membrane or vacuum foil and drawing vacuum. In analog workflow, openings for drawing vacuum of the negative to the precursor are located at the perimeter of the exposure bed. In the present invention, the central location of one or more orifices 74 used to remove air and assure intimate contact between the precursor 20 and the exterior surface 28 and the position of the precursor over the orifice/s 74 would block the ability to draw the necessary vacuum for analog workflow. The present method of removing air between the precursor 20 and the exterior surface 28 of the bed 25 is conducted in the absence of the transparent membrane or covering that is used for analog exposure workflow.

The base assembly 12 includes the assembly 65 for controlling the temperature of the exposure bed 25 that is adjacent the second side 27 of the bed, which heats and cools the bed. The temperature-controlling assembly 65 for the bed 25 includes at least one coil 82 that has a fluid transported therein, and a means 84 for adjusting or changing the temperature of the fluid. In one embodiment, the at least one coil 82 is mounted into contact with the second side 27 of the exposure bed 25 with a silicone-based material that aids with the transfer of heating and/or cooling capacity from the coil 82 to the exposure bed. The coil 82 is made of metal, and can be for example, copper or aluminum. In most embodiments, there are two or more coils 82, each of which are substantially the same and have a length and a diameter that is the same, so as to provide uniform flow of the fluid through the coils 82 and thus can uniformly maintain coils at the same or substantially the same temperature. Each of the two or more coils 82 has an entry that is connected to a manifold 85 for supplying each of the coils with the fluid; and, has an exit to return the fluid into a separated section of the manifold.

Figure 10A:
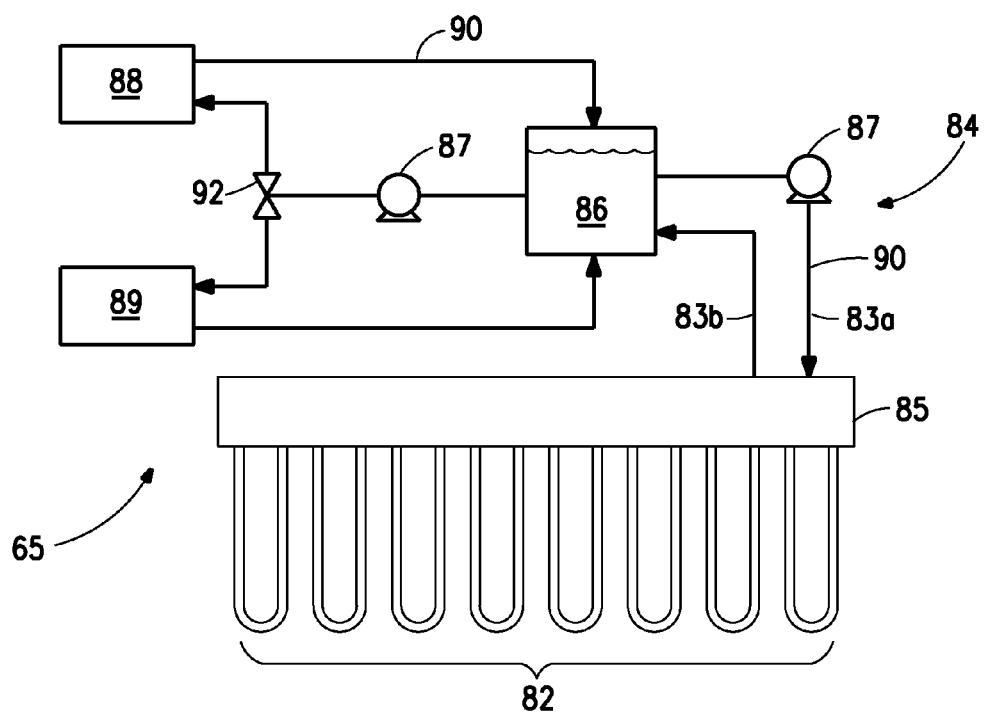
FIG. 10A is a schematic diagram of one embodiment of the fluid flow of the temperature-controlling assembly of the exposure bed of FIG. 8, showing one or more coils for transporting the fluid that is connected to a manifold and a reservoir, which is in fluid connection with a heater and a chiller for the fluid.
Figure 10B:
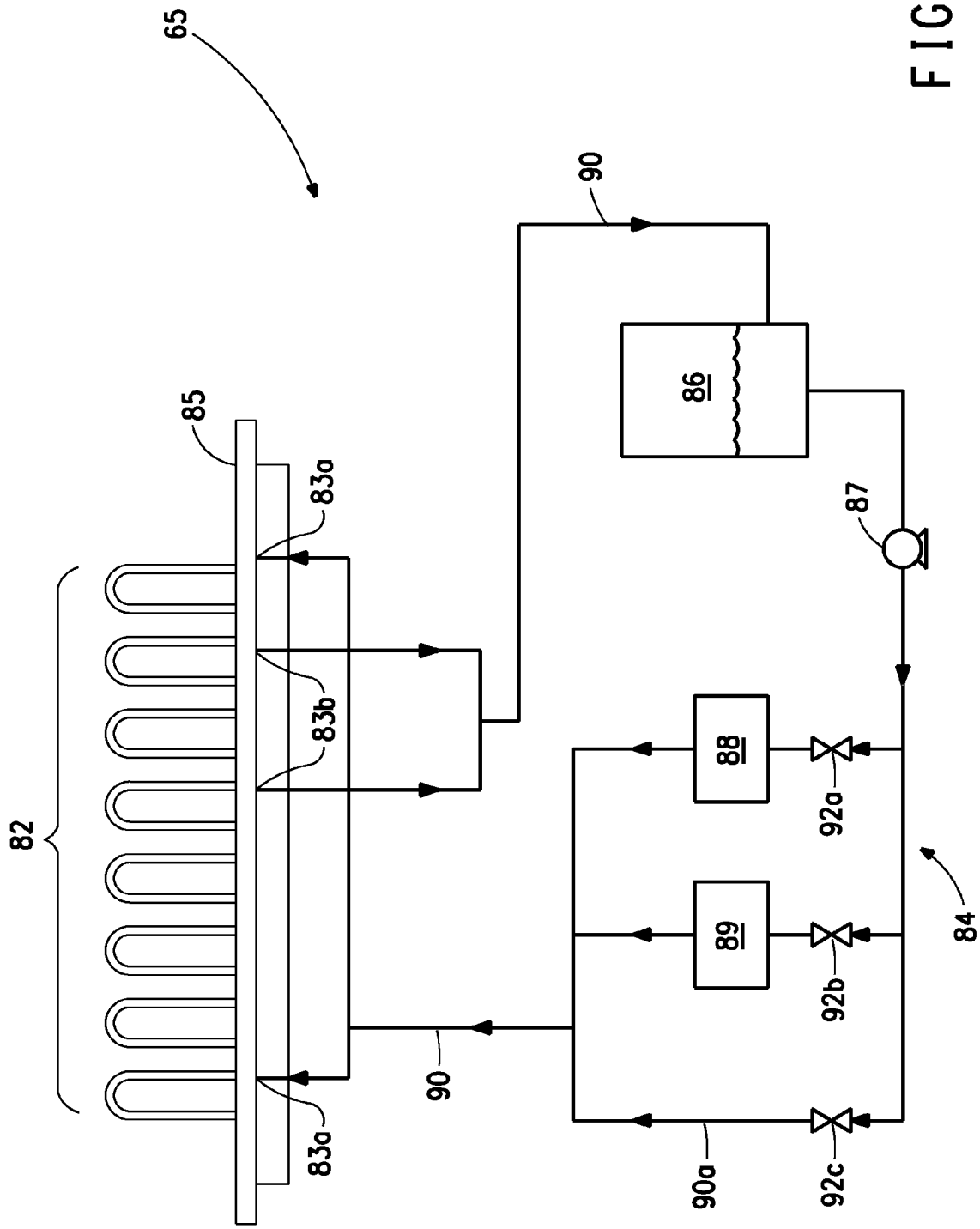
FIG. 10B is a schematic diagram of another embodiment of the fluid flow of the temperature-controlling assembly of the exposure bed of FIG. 8, showing one or more coils for transporting the fluid that is connected to a manifold and a reservoir, which is in fluid connection with a heater and a chiller for the fluid.

The temperature controlling assembly 65 for the exposure bed 25 can also include a reservoir 86 that is interspersed between the fluid entrance 83a to the manifold 85 and the fluid exit 83b from the manifold. One embodiment of fluid flow in the temperature controlling assembly 65 is shown in FIG. 10A. Another embodiment of fluid flow in the temperature controlling assembly 65 is shown in FIG. 10B. The reservoir 86 receives the fluid exiting the one or more coils 82 and the section of the manifold 85, and provides the fluid to the manifold. The fluid continuously circulates through the one or more coils 82, the manifold 85, conduits 90, and the reservoir 86 with the use of one or more pumps 87 and valves 92. The means 84 for changing the temperature of the fluid is configured to change the temperature of the fluid transported through the coils, which includes a heater 88 and a chiller 89. In the embodiment of FIG. 10A, each of the heater 88 and the chiller 89 is connected with conduits to the reservoir 86, to receive fluid from the reservoir and return the fluid after it is heated or cooled to the reservoir. In the embodiment of FIG. 10B, the heater 88 and the chiller 89 are each connected with conduits 90 to receive fluid from the reservoir 86 and send the fluid to the manifold 85 after it is heated or cooled. This embodiment also provides a separate conduit 90a and valve 92c for fluid flow between the reservoir 86 and the manifold 85. The means 84 for changing the temperature of the fluid can include one or more pumps 87 for transporting the fluid through the conduits 90, 90a and the heater 88 and chiller 89. If the exposure bed 25 needs to be heated to maintain its temperature and the precursor 20 at the target temperature, a valve 92a is operated to direct the fluid from the reservoir 86 to the heater 88 which raises the temperature of the fluid returning to the reservoir, which is then supplied to the manifold 85 that distributes the fluid to the coils 82. In most instances the heating of the exposure bed 25 occurs prior to start of the exposure, either before or after the precursor 20 is placed on the bed. If the exposure bed 25 needs to be cooled to maintain its temperature and the precursor 20 at the target temperature, a valve 92b is operated to direct the fluid from the reservoir 86 to the chiller 89 which lowers the temperature of the fluid returning to the reservoir, which is then supplied to the manifold 85 that distributes the fluid to the coils 82. In most instances cooling of the exposure bed 25 occurs during exposure of the precursor 20. In most embodiments the fluid transporting through the one or more coils 82 is water. The temperature of the exposure bed 25 can be measured by one or more contact sensors 73 or infrared sensors that are located in a central location on the second side 28 of the exposure bed. In some embodiments, the temperature of the exposure bed 25 is measured at only one location, which is considered representative the entire exposure bed.

In operation, the lamp housing assembly 14 is in the first location Lh and one or more of the pumps 87 for the temperature controlling assembly 65 for the exposure bed 25 are activated to circulate fluid through the coils 82, the manifold 85, and the reservoir 86. The temperature of the exposure bed 25 is determined with the temperature sensor 73 on the second side 27 of the bed, and compared to a target temperature for the bed. The temperature of the bed 25 is controlled to a target temperature by transporting the fluid through the coils 82, and heating or cooling the fluid. The exposure bed 25 is established and maintained at its target temperature due to the contact of the coils 82 with the second side 27 of the exposure bed and the thermal conductivity of the fluid and materials of the bed and coils. With particular reference of the fluid flow of the embodiment shown in FIG. 10B, the fluid continuously circulates through the coils 82, the manifold 85, conduit 90a and the reservoir 86 with the use of pump 87 and valves 92c is open, and valves 92a and 92b are closed. The programmable logic controller 56 is used to control the temperature of the exposure bed 25 by appropriate heating, cooling, and recirculating of fluid, as appropriate, through the coils 82, conduit 90, and reservoir 86. If the measured temperature of the bed 25 is less than the target temperature, the means 84 for adjusting the temperature of the fluid is activated, valve 92c may be closed, and the valve 92a is opened to direct the fluid in the reservoir 86 through the heater 88 to supply the manifold 85 and the coils 82 with warmed fluid, which then returns to the reservoir 86. If the measured temperature of the bed is greater than the target temperature, the means 84 for adjusting the temperature of the fluid is activated, valve 92c may be closed, and the valve 92b is opened to direct the fluid in the reservoir 86 through the chiller 89 to supply the manifold 85 and coils 82 with cooled fluid, which then returns to the reservoir 86 In either condition, the fluid continues to be circulated through the means 84 for adjusting the temperature of the fluid until the exposure bed 25 reaches the target temperature or within the target temperature range, at which time the valves 92a and 92b close, and valve 92c is opened to continue circulation of the fluid through the assembly 65 for controlling the temperature of the bed. Typically during exposure of the precursor 20, the exposure bed 25 heats up, and the means 84 to adjust the temperature of the fluid cooler is activated to maintain the bed at the target temperature or in the target temperature range. For example, during an exposure of about 15 minutes at 17-20 mWatts/cm$^2$, the temperature of exposure bed 25 and the precursor 20 could increase as much as 10° C., but for the presence of the temperature controlling assembly 65 of the exposure bed.

After the exposure bed 25 has reached its target temperature, the precursor 20 is placed on the exterior surface 28 of the exposure bed in a central location covering the four orifices 74 and the plurality of channels 78. The precursor 20 is stationary and remains in place on the exposure bed 25 during exposure. In one embodiment, the precursor 20 includes an in-situ mask, and the precursor is oriented with the in-situ mask facing the one or more lamps 32 of the lamp housing assembly 14 for imagewise exposure through the in-situ mask. If the precursor 20 is stored at room temperature, the precursor quickly adjusts to the temperature of the exposure bed 25 and reaches its target temperature. In some embodiments, the precursor 20 is stored so that the precursor has a temperature when positioned on the exposure bed that is no more than about 10° C. from the target exposure bed temperature. In most embodiments, the precursor 20 is stored so that the precursor has a temperature when positioned on the exposure bed that is no more than about 5° C. from the target exposure bed temperature. The greater the temperature difference between the precursor 20 as it is positioned on the exposure bed 25 and the temperature of the exposure bed itself, the longer it will take the precursor to equilibrate to the temperature of the bed or reach its target temperature. If the exposure is started before the precursor reaches target temperature some of the advantages in quality may not be fully realized. To facilitate the precursor 20 quickly reaching target temperature or temperature range, the vacuum pump 79 connected to the orifices 74 is activated removing air between the precursor 20 and the exterior surface 28. Depending upon the size of the precursor 20 and the number of orifices 74, and optional channels 78, it may take up to several minutes to remove the air between the precursor and the exterior surface through the orifices. In most embodiments the precursor reaches the target temperature or target temperature range within 60 seconds after the air is removed between the precursor 20 and the exterior surface 28 of the exposure bed 25.

The drive motor 41 is activated to transport the lamp housing assembly 14 to the second position Le or the exposure position that is adjacent the uppermost surface of the base assembly 12. Optionally, the lamp housing assembly 14 may undergo one or more steps to assure that the at least one lamp 32 of the lamp housing assembly 14 is energized to emit radiation at a target condition. The precursor 20 is exposed to the radiation emitting from the at least one lamp 32 with sufficient irradiance to substantially complete the photochemical reaction/s in the composition layer of the precursor. During exposure until completed, in most embodiments, the vacuum pump 79 continues to operate keeping the precursor 20 in intimate contact with the exterior surface 28 of the exposure bed 25 so that the precursor will quickly respond to changes that maintain the temperature of the exposure bed at the target temperature or in the target temperature range.

Lamp Housing Assembly

Figure 3A:
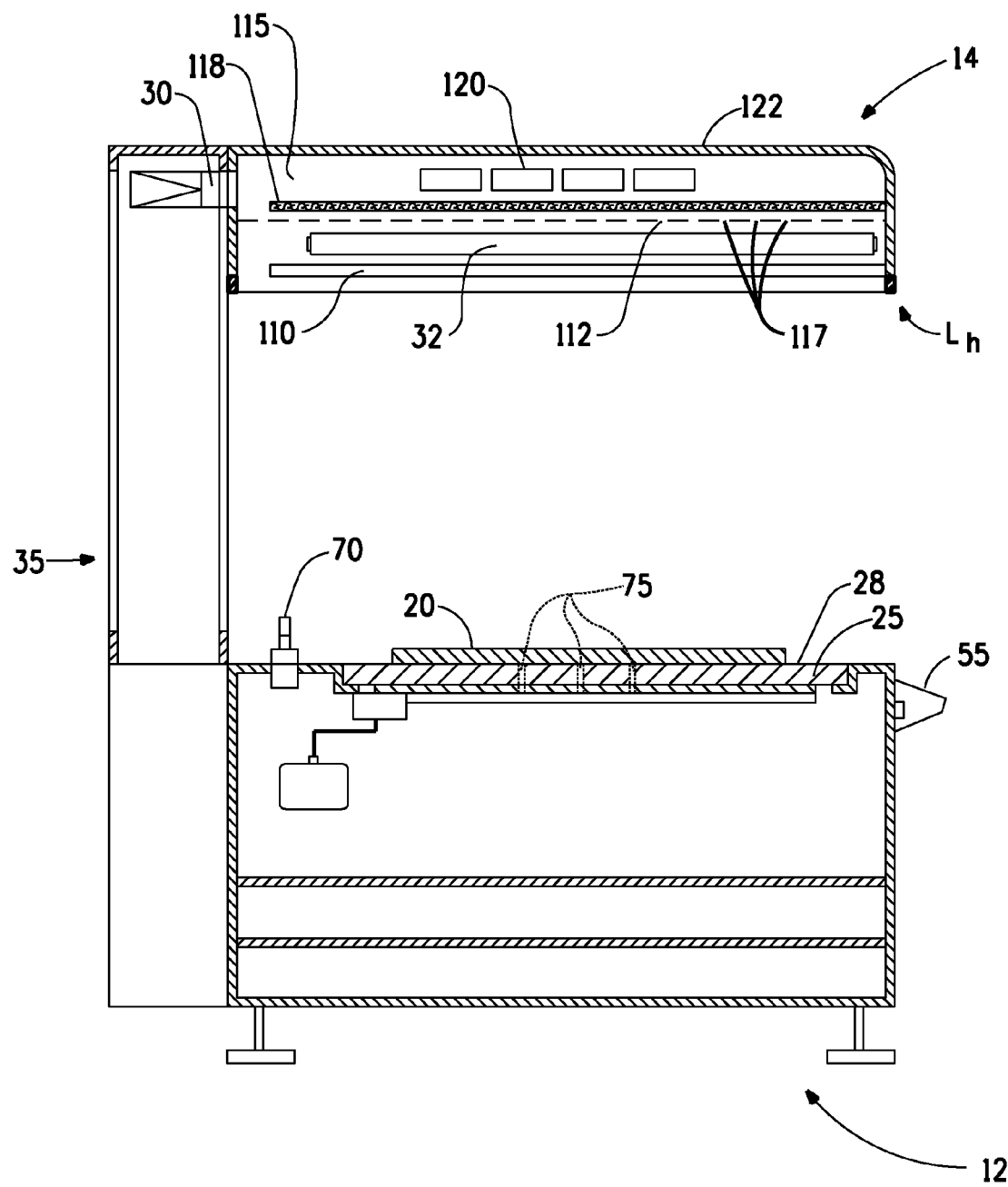
FIG. 3A is a schematic side view of one embodiment of the exposure apparatus shown in FIG. 1, taken along line 3A-3A of FIG. 2A in which the lamp housing assembly is in the first position, showing one embodiment of the lamp housing assembly that includes one embodiment of a lamp assembly having at least one lamp and at least one ballast, and one embodiment of an air distribution assembly having an air chamber and at least one blower; and, one embodiment of the base assembly that includes one embodiment of a movable sensor for determining irradiance of the at least one lamp, one embodiment of an exposure bed, and one embodiment of a means for controlling the temperature of the exposure bed.
Figure 3B:
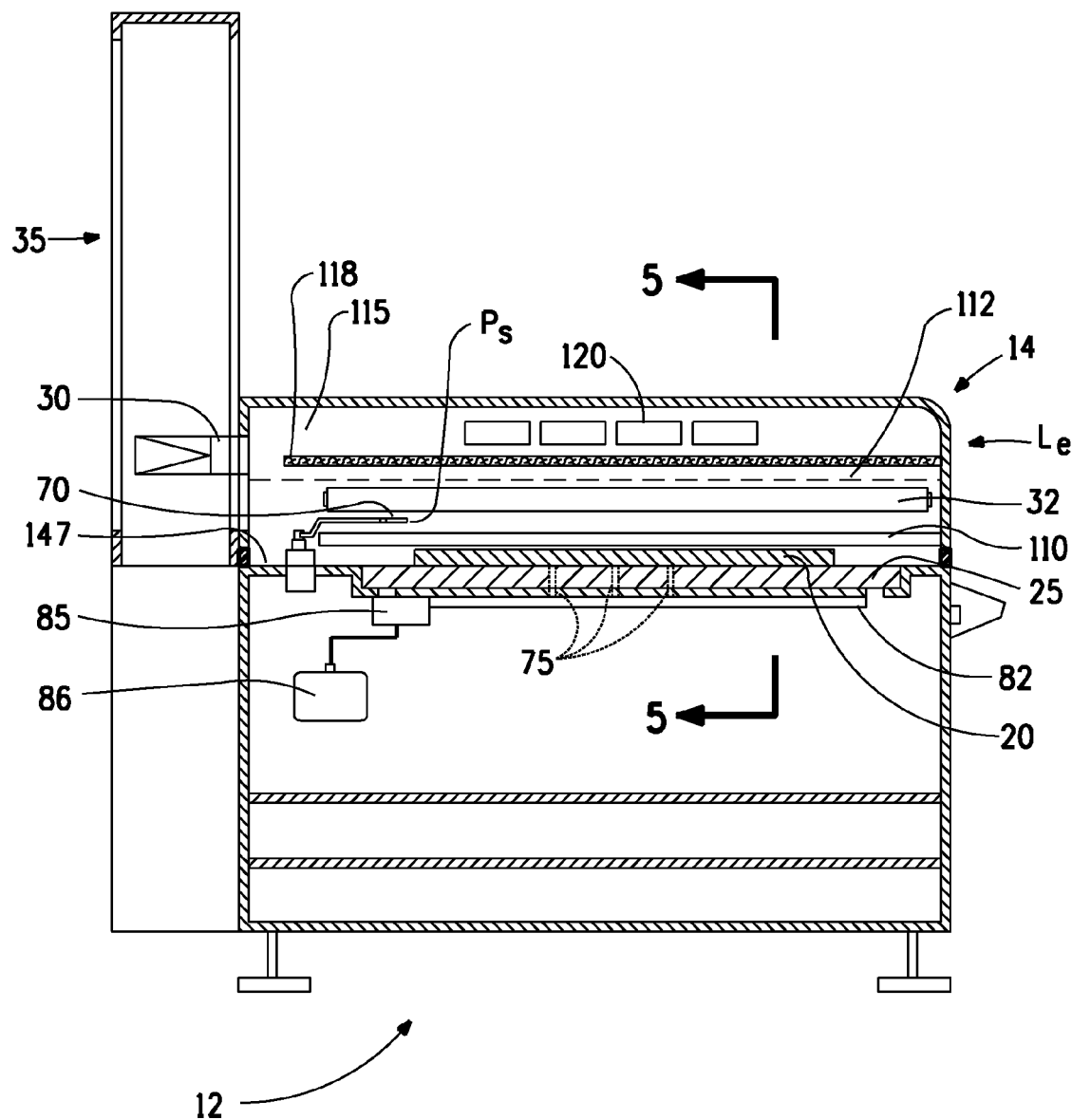
FIG. 3B is a schematic side view of one embodiment of the exposure apparatus shown in FIG. 1, taken along line 3B-3B of FIG. 2A in which the lamp housing assembly is in the second position, showing the movable sensor in a rotated position interposed in the lamp housing assembly.
Figure 4:
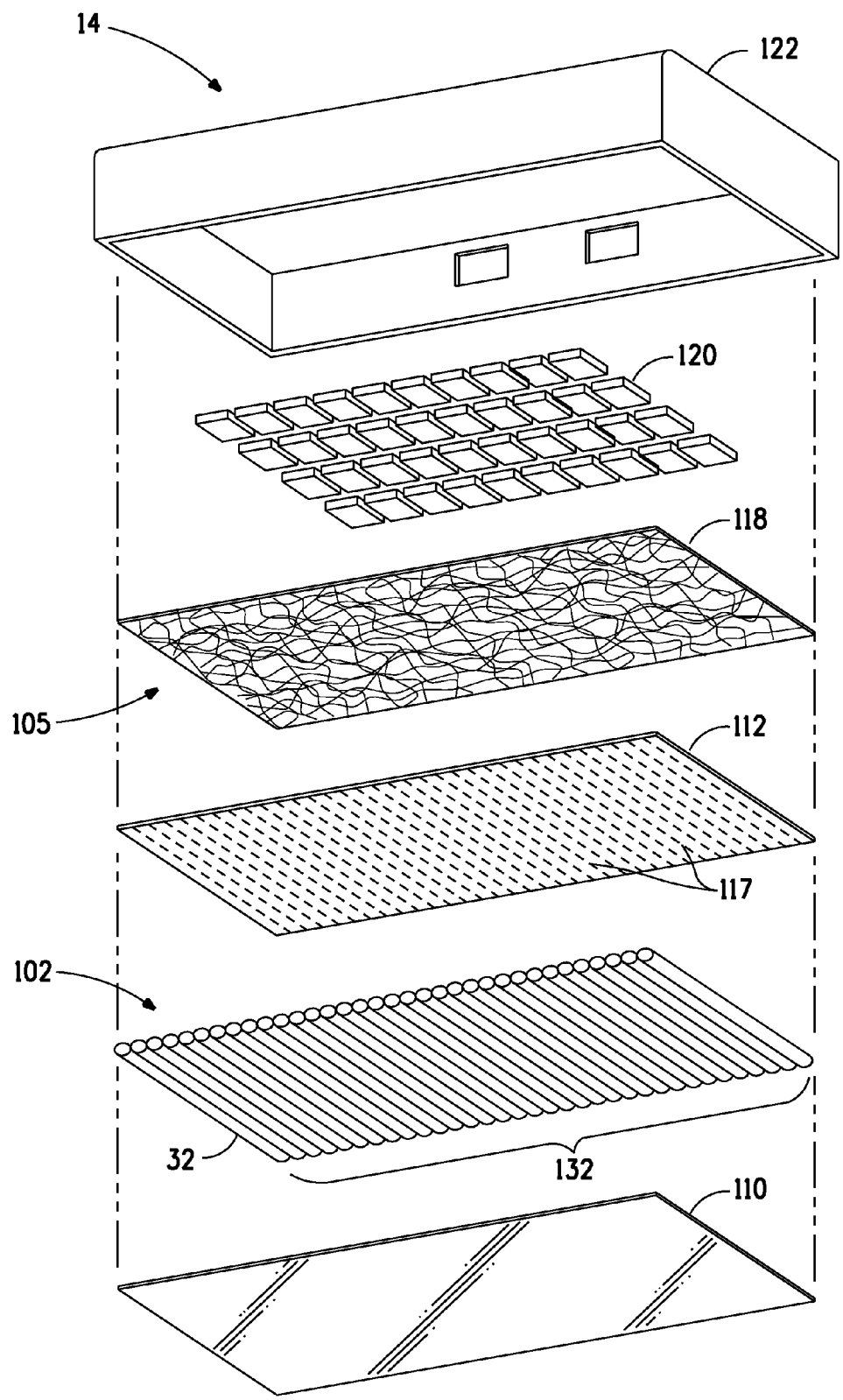
FIG. 4 is a schematic exploded view of one embodiment of the lamp housing assembly of the exposure apparatus of FIG. 3A, showing housing covers, a sheet of glass, a plurality of tubular lamps that are adjacent and substantially parallel to each other, a bottom panel of the air chamber in which the bottom panel is a sheet that includes openings, a layer of an air dispersing medium, and a plurality of ballasts for the lamps.

As shown in FIG. 3A, FIG. 3B, FIG. 4, FIG. 5, FIG. 6A, FIG. 6B, FIG. 7A, FIG. 7B, and FIG. 11, the lamp housing assembly 14 further includes a lamp assembly 102 having at least two lamps 32, an air distribution assembly 105, and one or more sensors 107 for measuring or determining temperature of at least one lamp 32, and one or more sensors 108 for measuring or determining irradiance emitted by at least one lamp at a wavelength or in a range of wavelengths. As shown in FIG. 4, the lamp housing assembly 14 is assembled with the following orientation of structures: an optional glass plate 110; at least two tubular lamps 32 for irradiating the precursor 20 with radiation during exposure; a sheet 112 forming a base of an air chamber 115 and having at least one opening 117 aligned with each of the at least one lamp 32; an optional air dispersing medium 118, at least one ballast 120 for each group of one to four lamps; a housing cover 122 for the air chamber 115; and, the at least one blower 30. The glass plate 110 need not be present in all embodiments of the lamp housing assembly 14. In embodiments in which the exposure apparatus 10 also has the capability for exposing a precursor 20 according to modified digital workflow, the glass plate 110 is included in the lamp housing assembly 14 since the glass forms a top of an enclosure 58 so that the precursor, which is contained in the enclosure, can be exposed in an environment of an inert gas and a designated concentration of oxygen. In some embodiments, the lamp assembly 102 includes the at least two lamps 32, and the at least one ballast 120. The air distribution assembly 105 includes the sheet 112 having at least one opening 117 for each lamp 32, the cover 122, and the at least one blower 30, and optionally the layer of the air dispersing medium 118. The at least one lamp 32; the at least one ballast 120; sensors 70, 73, 107, 108; at least one blower 30, are energized with a power source (not shown).

In the present exposure apparatus 10, the source of radiation used for exposing the precursor 20 is at least two lamps 32 that are in the form of tubular lamps. In most embodiments, the tubular lamps 32 are fluorescent lamps that include materials which emit sufficient actinic radiation at the wavelength needed for photoreaction of the photosensitive composition of the precursor 20. Each of the at least two lamps 32 have a tubular length and a backside 130a, and a front side 130b. The at least two lamps 32 of the lamp assembly 102 are adjacent and parallel to each other. In the embodiment shown, the lamps 32 are oriented with the length of the lamp going from front side to the back side of the exposure apparatus 10. The lamps may be referred to herein as tubular lamps, or light tubes. The at least two lamps 32 in most embodiments is a plurality of lamps 132 that because they are adjacent and parallel and form a plane can be considered a bank of lamps. The bank of lamps may also be referred to as a wall, or an array, or a row of lamps or light tubes. The number of light tubes in the plurality of lamps 132 is not particularly limited provided that there are a sufficient number of tubular lamps 32 to fully irradiate with sufficient uniformity of energy the surface of the precursor 20 to be exposed. In some embodiments, the number of tubular lamps 32 in the plurality of lamps 132 is from five to fifty. In other embodiments, the number of tubular lamps 32 in the plurality of lamps 132 is from fifteen to forty. The number of tubular lamps 32 in the plurality of lamps 132 in some other embodiments is thirty to thirty-six, and in yet other embodiments is fourteen to eighteen. In most embodiments, all lamps 32 of the plurality of tubular lamps 132 are energized to emit radiation for an exposure. Energizing all the lamps 32 for every exposure assures that all lamps in the plurality of lamps 132 age at about the same rate, and thus that the quality of the exposure on precursor 20 is consistent for an extended time of operation of the apparatus 10. In most embodiments, each lamp 32 of the plurality of tubular lamps 132 has power between 60 to 140 watts. In one embodiment, each lamp 32 of the plurality of tubular lamps 132 has a length at least as long as a width or length of the exposure bed 25. In most embodiments, the lamps 32 of the plurality of tubular lamps 132 have a length that is longer than the length or width of the exposure bed 25. In most embodiments, when the lamp housing assembly 14 is in the exposure position Le, the front side 130b of plurality of tubular lamps 132 can be at a distance of about 2 to about 6 inches (about 5 to about 15 cm) from a surface of the precursor 20 that faces the lamps, i.e., exposed surface. In some other embodiments, the front side 130*b* of the plurality of tubular lamps 132 can be at a distance of about 2.4 to about 4 inch (about 6 to 10 cm) from the exposed surface of the precursor 20. The exposure time may vary from a few seconds to many minutes, depending upon the intensity and spectral energy distribution of the radiation, the distance of the plurality of light tubes from the precursor, and the nature and thickness of the photopolymerizable material of the precursor 20.

In one embodiment of the exposure apparatus 10, each lamp 32 or light tube in the plurality of tubular lamps 132 can emit radiation at the same or substantially the same wavelength or wavelength range. In this embodiment, for example, each lamp 32 in the plurality of light tubes 132 can emit ultraviolet radiation at wavelengths in the range of 310 to 400 nm (which may be sometimes be referred to as ultraviolet-A radiation, (UV-A)). This embodiment is particularly useful for imagewise exposing the precursor 20 (through the in-situ mask), blanket exposing through the back side of the precursor, and can also be useful for post-exposing the precursor to complete the photopolymerization process (after relief is formed). A particularly suitable lamp 32 for the plurality of tubular lamps 132 is a 140 Watt fluorescent lamp, Model No. TL140W-10-R (made by Philips Corp., from Amsterdam, Netherlands) for exposing with UV-A ultraviolet radiation. This suitable lamp has an irradiance capacity that is about 17 to about 30 mWatts/cm$^2$, which range is wider than the irradiance capacity range of many conventional fluorescent tubular lamps, i.e., typically about 18 to 24 mWatts/cm$^2$, that are used in conventional exposure apparatuses. The wider range of irradiance capacity by the particularly suitable lamp extends the lifetime at which the lamp emits at the desired irradiance or at the target range of irradiance.

In an alternate embodiment of the exposure apparatus 10, the plurality of light tubes 132 can include at least two types of lamps, wherein each type of lamp emits radiation at a different wavelength or range of wavelengths. In this alternate embodiment, for example, one type of lamp in the plurality of light tubes may emit ultraviolet radiation at wavelengths in the range of 310 to 400 nm (UV-A), and another type of lamp in the plurality of light tubes may emit ultraviolet radiation at wavelengths in the range of 200 to about 300 nm, which may be referred to as ultraviolet-c radiation (UV-C)). In most embodiments, the two types of lamps would be in alternating positions along the wall of the plurality of light tubes. This embodiment is particularly useful for combining the steps of post-exposure and finishing exposure to expose at the same time a precursor 20 that has already been treated to form the relief surface, in which post-exposure completes the polymerization process, and the finishing exposure is used to detackify the relief surface of the printing plate. Thus, any one or more of the features that are described herein primarily for use with the imagewise exposure or back exposure of the precursor, can also be used alone or in any combination, for finishing exposure and/or post exposure, which includes the temperature-controlled exposure bed; and/or, the lamp assembly having an air distribution assembly for controlling temperature and/or irradiance of at least one lamp; and/or, the lamp assembly including an adjustable ballast coupled to one or more lamps that adjusts the power received by the lamp or lamps, for exposing the precursor to actinic radiation. However, the use of one or more of these features for finishing exposure and/or post exposure may not have the same advantages to the precursor as is realized for imagewise exposure.

In most embodiments, the lamp assembly 102 is composed of two or more lamps, i.e., the plurality of lamps 132, in which each lamp 32 is mounted between two sockets (not shown) in a bracket (not shown) to be adjacent and parallel to each other so as to form the bank of lamps; and, a ballast 120 is provided for groups of one to four lamps. In one embodiment, each lamp 32 is connected to one ballast 120. In another embodiment, two lamps 32 are grouped and connected to one ballast 120. In some other embodiment, three lamps 32 are grouped and connected to one ballast 120. In some other embodiment, four lamps 32 are grouped and connected to one ballast 120. Ballast 120 at least provides the necessary voltage to start the lamp or group of lamps 32. In some embodiments, the ballast 120 can also be used to stabilize or maintain power to the lamp 32. In some embodiments of the present apparatus 10, the type of ballast is not limited, and can include for example, electronic and electromagnetic. In one embodiment, the ballast is electronic ballast.

In some embodiments, the ballast 120 is an adjustable ballast, which may also be referred to as a dimmable ballast, that adjusts the power received by the lamp or group of lamps 32. The adjustable ballast 120 is connected to at least one lamp 32 and controls the power received by the at least one lamp from the power source, by adjusting its voltage. In most embodiments the exposure apparatus 10 also includes a ballast dimmer controller (not shown) that interfaces with the adjustable ballast/s 120 and the lamp/s 32 to control adjustable ballasts and the lamp output. The adjustable ballast 120 can be provided for groups of one to four lamps. In the embodiment shown, each lamp 32 of the lamp assembly 102 is connected to an adjustable ballast 120. The ballasts 120 are mounted on bracket support (not shown) within the air chamber 115 above the metal sheet 112. In some embodiments, each adjustable ballast 120 can be adjusted to provide about 5 to 100% of the maximum power from the power source (not shown) to the lamp or group of lamps 32, i.e., the adjustable ballast allows about 95% to 0% of the power to the lamp/s. In some other embodiments, each adjustable ballast 120 can be adjusted to provide about 20 to 100% of the maximum power from the power source to the lamp or group of lamps 32; i.e., the adjustable ballast allows about 80% to 0% of the power to the lamp/s. In yet other embodiments, each adjustable ballast 120 can be adjusted to provide about 10 to about 80% of the maximum power from the power source to the lamp or group of lamps 32; i.e., the adjustable ballast allows about 90% to 20% of the power to the lamp/s. In still other embodiments, each adjustable ballast 120 can be adjusted to provide about 30 to about 90% of the maximum power from the power source to the lamp or group of lamps 32; i.e., the adjustable ballast allows about 70% to 10% of the power to the lamp/s. Adjustment of the power to the lamp or lamps by the ballast 120, adjusts the irradiance emitting from the lamp or lamps 32. An adjustable ballast that is suitable for use in some embodiments of the exposure apparatus 10 is a Dimmable Electronic Ballast EVL230 available from Eckerle Industrie Elektronik GmbH (Malsch, Germany). In the embodiment shown, the ballasts 120, which can be the adjustable ballasts 120, for the lamps 32 are located within the air chamber 115. The ballasts 120 are mounted on a support frame-like platform (not shown) sufficiently above the sheet 112 so as not to block the opening/s 117 of the sheet 112 and to allow for air to flow through the air chamber 115.

Optionally, each lamp assembly 102 can include a transformer (not shown) for pre-heating a coil in the lamp 32. In one embodiment, a transformer is mounted on a side of the bracket opposite the light tube, i.e., a backside of the bracket, and is connected to the socket. The preheating of the coil of the lamp 32 by the optional transformer typically increases the operational lifetime of the lamp, i.e., extending the time at which the lamp provides the desired radiation output. In the embodiment shown, the filament pre-heating transformer is included with the dimmable ballast.

In some embodiments, in order to assure consistent quality of exposure, i.e., the radiation emitted by the plurality of tubular lamps 102 is consistent, for a single exposure of a precursor, as well as for one exposure of a precursor to another exposure of a different precursor, i.e., for exposures of multiple precursors over a period of time, each lamp 32 of the plurality of tubular lamps 132 is maintained at a constant or substantially constant temperature, or within a temperature range. The maintaining of each lamp 32 of the plurality of light tubes 132 at a constant or substantially constant temperature or in a temperature range aids in providing consistent quality of radiation emitted for each exposure, and in extending the lifetime of the lamps. In some embodiments, each lamp 32 of the plurality of light tubes 132 is maintained at a temperature between 30 to 60° C. In most embodiments, each lamp 32 is maintained at less than 55° C., and in particular from 40 to 55° C. In some other embodiments, each lamp 32 of the plurality of light tubes 132 is maintained at a target temperature plus or minus 5° C. The temperature of each lamp 32 of the plurality of light tubes 132 can be measured by one or more contact or infrared sensors. In some embodiments, the temperature of only one lamp 32 is measured which is considered representative of the temperature of each of the lamps 32 in the plurality of light tubes 132. In the embodiment shown, the sensor 107 for measuring the temperature of a representative lamp 32 is located at the backside 130a of one lamp 32 about midway in the bank of lamps 132.

In some embodiments, in order to assure consistent quality of exposure, i.e., the radiation emitted by the plurality of tubular lamps 132 is consistent, for a single exposure of a precursor, as well as for one exposure of a precursor to another exposure of a different precursor, i.e., for exposures of multiple precursors over a period of time, each lamp 32 of the plurality of light tubes 132 is maintained at a constant or substantially constant irradiance, or within an irradiance range. The maintaining of each lamp 32 of the plurality of light tubes 132 at a constant or substantially constant irradiance or in an irradiance range aids in providing consistent quality of radiation emitted for each exposure, and in extending or substantially extending the lifetime of the lamps. In some embodiments, each lamp 32 of the plurality of light tubes 132 is maintained at irradiance of about 17 to about 22 milliWatts/cm². In most embodiments, each lamp is maintained at an irradiance of about 17 to about 20 mWatts/cm².

The irradiance of each lamp 32 of the plurality of light tubes 132 can be measured by one or more irradiance sensors 70, 108a, 108b. The irradiance sensors 70, 108a, 108b are sensitive to the wavelength or the range of wavelengths emitted by the lamp/s 32 for the exposure and responsive to, i.e., measure, the irradiance emitted from the lamp 32. In some cases, the irradiance sensors 70, 108a, 108b measure the peak irradiance emitted from the lamp/s 32. Since the lamp assembly housing 14 is in the exposure position Le when the sensors 70, 108a, 108b are activated, the position of the lamp/s 32 relative to the sensors is the same or substantially the same and the temperature of the lamp/s is maintained by the air distribution assembly 105, measurement by the irradiance sensors 70, 108a, 108b will detect changes to the irradiance emitting from the lamp/s 32 that is due primarily to use and aging. In some embodiments, the irradiance of only one lamp 32 is measured which is representative of the irradiance of each of the lamps in the plurality of light tubes 132. In one embodiment shown in FIG. 5, a stationary irradiance sensor 108a for measuring the irradiance of a representative lamp 32 is located at the front side 130b of the lamp 32 (opposite the backside of one lamp) in the bank of lamps 132. The stationary irradiance sensor 108a can be located at substantially any one lamp 32 of the plurality of lamps 132, and substantially anywhere along the length of one tubular lamp 32, except close to the ends of the tubes 32 or the first or last lamp of the bank of lamps 132 to avoid end effects. In an alternate embodiment also shown in FIG. 5 for simplicity, a stationary irradiance sensor 108b can be located at or near the exposure bed 25, typically near or at a perimeter of the exposure bed, so as not to be disturbed by placement of the precursor on the bed 25 or the seal 53. Sensors that are suitable for measuring irradiance in some embodiments of the exposure apparatus are UV-A Sensor Models 16163 and 16164 available from ATE-Consys GmbH (Bunde, Germany). These are suitable for both the stationary and the scanning irradiance sensors, 70, 108a, 108b.

Figure 7A:
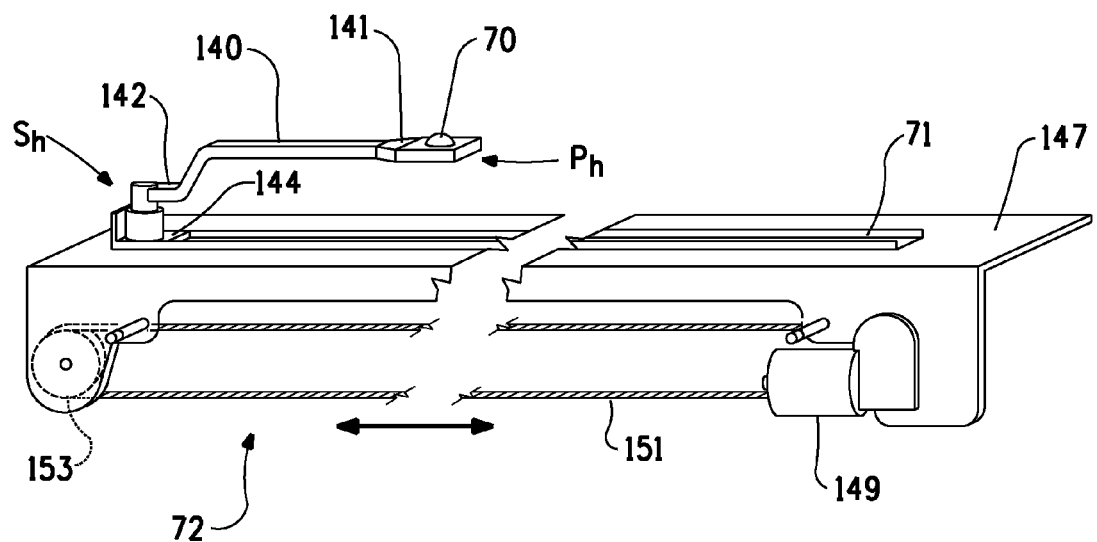
FIG. 7A is a schematic perspective view of one embodiment of a transport assembly for the movable irradiance sensor of the base assembly.
Figure 7B:
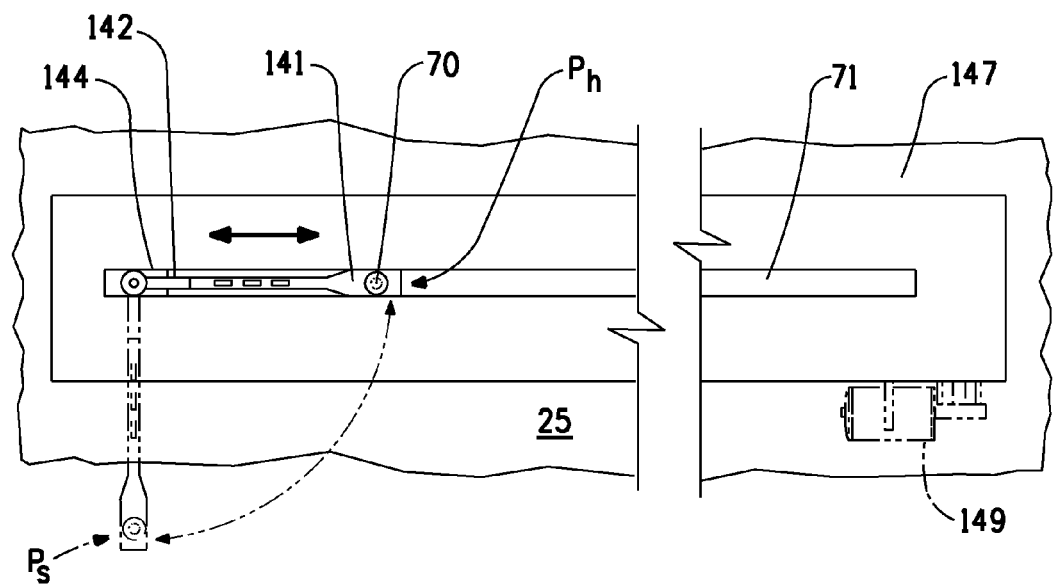
FIG. 7B is a schematic planar top view of the transport assembly and the movable irradiation sensor shown in FIG. 7A, showing the rotated position of the movable irradiation sensor.
Figure 8:
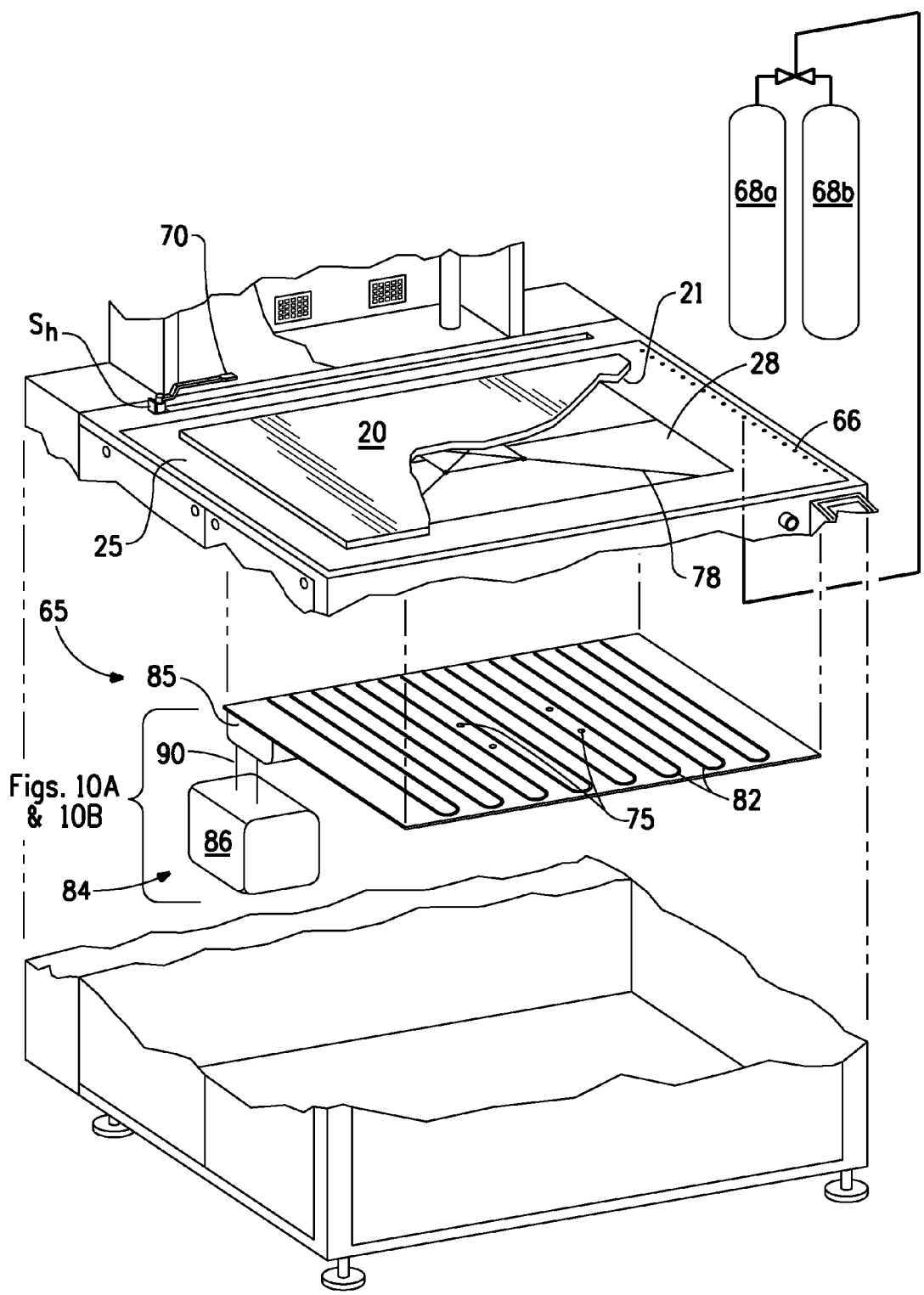
FIG. 8 is a schematic exploded view of one embodiment of the base assembly of the exposure apparatus of FIG. 3A, showing a partial cut-away view of the photosensitive element supported on the exposure bed and one embodiment of the means for controlling the temperature of the exposure bed that includes an assembly of at least one coil having a fluid transported therein to allow for heating and cooling of the exposure bed, and a means for adjusting the temperature of the fluid in the coil.
Figure 9:
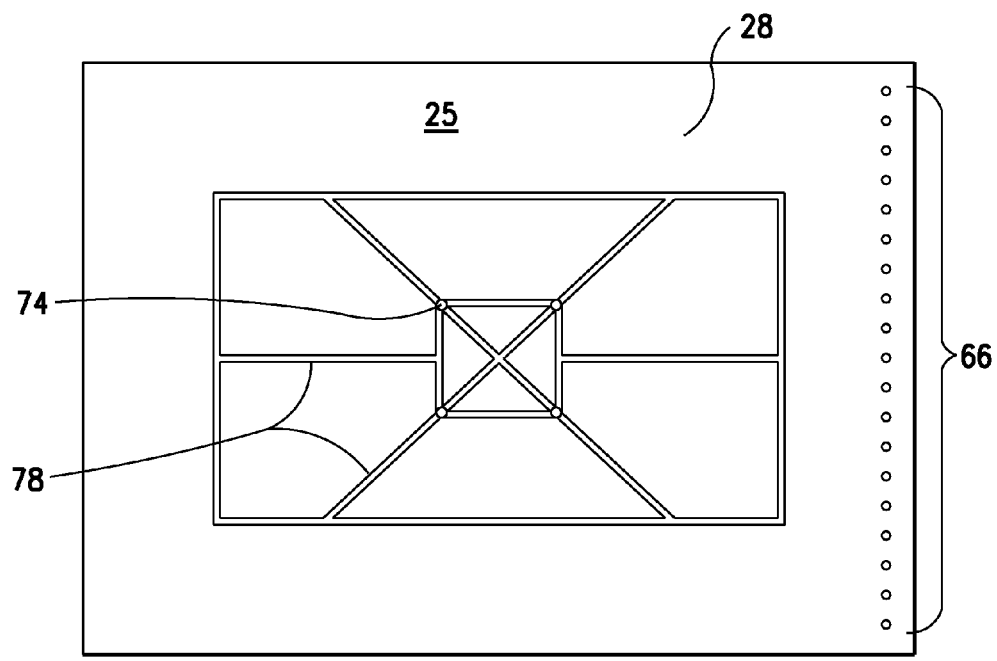
FIG. 9 is a schematic planar top view of one embodiment of the exposure bed of the base assembly embodiment of FIG. 8, showing an exterior surface of the exposure bed having at least one orifice connecting to one or more channels as means for removing air from between the photosensitive element (not shown) and the exterior surface of the exposure bed.

One embodiment of the exposure apparatus 10 shown in FIGS. 7A and 7B includes another irradiance sensor 70 that can be moved from one to two or more positions along a passage 71 that is adjacent to and near the backside of the exposure bed 25 by a transport assembly 72. Since the passage 71 is orthogonal to the parallel orientation of the bank of lamps 132, the transport assembly 72 moves the scanning irradiance sensor 70 along the passage 71 and opposite or substantially opposite each lamp 32 of the plurality of lamps 132 to measure the intensity or irradiance emitting by each lamp.

The irradiance sensor transport assembly 72 includes an arm member 140 having one end 141 that elevates and supports the irradiance sensor 70 and a second end 142 connected for rotation on a platform 144. Mounted to the platform 144 is a motor 145 that is coupled to the arm end 142 for rotating the arm 140 from a home position Ph that is aligned with the passage 71 to a scanning position Ps that is oriented about 90 degrees from the passage 71 and substantially aligned to the length of one of the lamps 32 of the plurality of lamps 132. As shown in FIG. 3B and FIG. 5, rotation of the arm 140 to the scanning position Ps locates the scanning irradiance sensor 70 between the glass plate 110 and the bank of lamps 132 and adjacent to the front side 130b of one lamp 32 of the plurality of lamps 132. The platform 144 includes two couplings (not shown) that each engage with a side of a slotted track (not shown) that is attached to an underside of a support 147 for the exposure bed 25, and that is adjacent and parallel to the passage 71. The transport assembly 72 includes a transport motor 149 that is mounted at or near an end of the passage 71 opposite the home station Sh of the sensor 70. The platform 144 is coupled to a drive belt 151 that is connected between a sprocket or toothed wheel 153 and a second sprocket wheel (not shown) that is coupled to the transport motor 149. When the motor 149 is activated, the belt 151 moves about the sprocket wheel 153 and second sprocket wheel causing the couplings to slide or move along their respective tracks and thereby move the platform 144 with the arm 140 and the irradiance sensor 70 along the passage 71.

In some embodiments of a method of maintaining the irradiance of each of the lamps 32 or of calibrating the irradiance emitting from each of the lamps 32, all lamps 32 of the plurality of lamps 132 are energized prior to determining the irradiance of any one lamp. Having all the lamps 132 energized, even though the scanning irradiance sensor 70 is substantially determining the irradiance of the each lamp 32 individually, is more representative of the radiation condition that the precursor 20 experiences during an exposure. So although the scanning irradiance sensor 70 is substantially determining the irradiance of the each lamp individually, the irradiance from one or more lamps adjacent to the lamp that is being measuring may be detected by the irradiance sensor/s. In another embodiment of a method of maintaining the irradiance of each of the lamps or of calibrating the irradiance emitting from each of the lamps 32, only the lamp 32 that is being measured for irradiance is energized. However, as each lamp 32 should at least be at its target temperature before determining its respective irradiance, it will take considerably long time to complete the irradiance measurement for all lamps of the plurality of lamps 132.

The plurality of light tubes 132 when energized typically generates heat, which particularly in an enclosed environment interior to the exposure apparatus 10 can influence the temperature of the lamps 32, as well as the irradiance of the lamps, during exposures. So much heat may be generated by the lamps 32 that the lamps overheat, and it can become difficult to maintain the temperature of the lamps within the desired temperature range. It is desirable to maintain the temperature constant from lamp to lamp within the plurality of light tubes 132, as well as along the axial length of each of the lamps, and avoid relatively hot or cool regions in the lamps and from lamp to lamp. It is also desirable to maintain the irradiance constant or substantially constant from lamp to lamp within the plurality of light tube 132. In most embodiments, during a single exposure the irradiance of the lamp or lamps 32 will not significantly drop off or age but the irradiance can be influenced by the temperature of the lamp or lamps.

One embodiment of the present exposure apparatus 10 and method of use includes an air distribution assembly 105 which provides the capability to maintain the two or more tubular lamps 32 at a constant or substantially constant temperature or within a small range of temperature during exposure. The air distribution assembly 105 can also provide the capability to maintain the two or more tubular lamps 32 at a constant or substantially constant irradiance or within a small range of irradiance during exposure. For example, in one embodiment of the present apparatus the uniformity of the irradiance emitted in a range of 17 to 20 mW/cm$^2$ by the one or more lamps 32 due to air impinging the lamps by the air distribution assembly 105 is about +/−5%. That is, the irradiance emitted by the one or more lamps 32 and impinging the exterior surface 28 of the exposure bed 25 and the precursor 20 thereon will vary by no more than +/−5%. In addition to the uniformity to the irradiance emitted by each lamp, the air distribution assembly also provides similar uniformity of about +/−5% of the irradiance emitted by the plurality of lamps 132 at the exposure bed, i.e., from edge-to-edge of the planar area of the bed, and thus impinging the precursor 20 that resides on the bed.

The air distribution assembly 105 includes the air chamber 115 and the at least one blower 30. The air chamber 115 that is formed by the sheet 112 having the at least one opening 117 aligned to each of the at least two lamps 32 as a bottom of the chamber, the cover 122 as a top of the chamber, and sides or cover panels 16 of the lamp housing assembly 14 complete the enclosure of the air chamber. The sheet 112 includes at least one opening 117 for each lamp 32 of the two or more lamps, wherein each opening is aligned parallel to the length of the tubular lamp, and directs the air exiting the opening to impinge the backside 130a of the lamp. In some embodiments the sheet 112 includes one opening 117 for each lamp 32 of the plurality of lamps 132. In some other embodiments, the sheet 112 includes more than one opening 117 for each lamp 32 of the plurality of lamps 132. In most embodiments, the sheet 112 includes a plurality of openings 117, such as slits, for each lamp 32 of the plurality of lamps 132, wherein the plurality of openings are aligned with the length of each lamp. The sheet 112 can be made of any material capable of withstanding conditions, i.e., heat, radiation, within the exposure apparatus 10. In most embodiments, the sheet 112 is made of metal, and in one embodiment is made of aluminium. In some embodiments, the sheet 112 is polished to be reflective and/or includes a reflective coating on a surface facing the lamp/s 32.

Optionally, the air chamber 115 includes an air dispersing medium 118 that forms a layer adjacent to an interior side of the sheet 112 that is opposite to a side of the sheet facing the plurality of lamps 132. The air dispersing medium 118 helps to uniformly distribute the air in the chamber 115 to each of the plurality of openings 117 in the sheet 112. In some embodiments, the air dispersing medium 118 is a second sheet (not shown) having a plurality of different sizes of openings, and not aligned with the openings on the sheet 112 forming the bottom of the chamber 115. In another embodiment, the air dispersing medium 118 is a nonwoven material. In the embodiment shown in FIG. 4 and FIG. 5, the air dispersing medium 118 is a non-compressed nonwoven material having a thickness of about 0.7 to about 3.0 cm. In some embodiments, the layer of air dispersing medium 118 contacts with the interior side of the sheet 112 having the openings 117. In some other embodiments, the layer of air dispersing medium is offset and does not contact the interior side of the sheet 112.

The at least one blower 30 pressurizes the air in the air chamber 115 such that the air is expelled from each of the one or more openings 117 in the sheet 112 and exits all the openings at the same or substantially the same volumetric rate. In the embodiment shown, the air distribution assembly 105 includes two blowers 30. The blowers 30 each include an air intake duct 160 having an intake port 162 that mates with filters 164a, 164b located in a back ventilation panel 16 of the upright housing 35. The filters 164a,164b filter the air that enters through the duct 160 and exits at an outlet 166 into the air chamber 115. The entering air is at room temperature. The at least one blower 30 is mounted to the lamp housing assembly 14 and moves with the lamp housing assembly as it is transported to and from the base housing assembly 12. The air intake duct 160 mates with a first filter 164a when the lamp housing assembly 14 is in the first location Lh, and mates with a second filter 164b when the lamp housing assembly 12 is in the second location Le. In most embodiments, the at least one blower 30 is continuously operating, bringing air into the chamber 115 to pressurize the chamber, while at least the one or more lamps 32 are energized. Since the air chamber 115 is pressurized, the air exits the openings 117 in the sheet 112 that forms the bottom of the chamber at a uniform or substantially uniform volumetric flow rate and impinges upon the backside 130a of the lamps 32. The blower or blowers 30 will change frequency or current to increase the air into the air chamber 115 and thus the volumetric flow rate exiting the sheet openings 117 and impinging the backside 130a of the lamps thereby cooling the lamps; and, to decrease the air into the air chamber 115 and thus the volumetric flow rate exiting the sheet openings 117 and impinging the backside 130a of the lamps 32 to thereby allow the lamps to warm or heat up. In some other embodiments, one of the blowers 30 continuously operates, while the second blower cycles on and off to adjust the volumetric flow rate of the air exiting the sheet openings 117. In one embodiment of operating the exposure apparatus 10 to expose a precursor 20 to actinic radiation, the exposure apparatus includes the lamp assembly 102 that has two or more lamps 32, i.e., a plurality of lamps 132, the air distribution assembly 105 having the air chamber 115 and two blowers 30, and the temperature sensor 107 for the lamp/s and/or the irradiance sensor 108a, 108b for the lamp/s which in one embodiment is the stationary irradiance sensor. The precursor 20 is positioned on an exposure bed 25. Optionally, exposure bed 25 may undergo one or more steps to assure that the bed and the precursor 20 positioned on the bed are at desired conditions. The following steps may occur in any order prior to the start of the exposure of the precursor 20: the lamp housing assembly 14 is moved to the exposure location Le; the plurality of lamps 132 of the lamp assembly 102 is energized; and the blowers 30 in the air distribution assembly 105 are activated.

At the exposure location Le, radiation emitting from the front side 130b of the energized plurality of lamps 132 irradiates the precursor 20. During at least the exposure of the precursor 20, air impinges the backside 130a of each of the plurality of lamps 132 at a volumetric rate exiting from the air chamber 115 that is adjacent the backside of the plurality lamps. In one embodiment, the volumetric rate of air generated from the air chamber 115 of the air distribution assembly 105 that impinges the plurality of lamps 132 can be about 1.3 meter$^3$ per minute for minimum cooling of the lamps, to about 10 meter$^3$ per minute for maximum cooling of the lamps. In an embodiment in which the plurality of lamps 132 includes thirty-four individual lamps, the volumetric rate of air exiting the opening or plurality of openings 117 for one lamp (of the 34) is approximately 1/34th of the volumetric rate of air being generated by the air distribution assembly 105. The air exits the air chamber 115 through the plurality of openings 117 of the sheet 112 that are aligned parallel to the tubular length for each of the lamps 32. The activated blowers 30 draw air from the room in to pressurize the air chamber 115 which uniformly distributes the air exiting each of the plurality of openings 117. The blowers 30 are adjusted, i.e., frequency, with power or current to change the air pressure in the chamber 115. The volumetric rate of the air impinging the at least two lamps 32 is controlled by maintaining the temperature of the lamp/s 32, or the irradiance of the lamp/s 32, or both the temperature and the irradiance of the lamps, to a target temperature and/or target irradiance. In most embodiments, the temperature of the lamp 32 is measured with the temperature sensor 107, and the blower/s 30 is adjusted to change its frequency, i.e., volume of blown air, which adjusts the air exiting the air chamber 115 through the one or more openings 117 based on the measured temperature relative to the target temperature. In some other embodiments, the irradiance of the lamps is measured with one of the stationary irradiance sensor 108a, 108b and the blower/s 30 is adjusted to change its frequency, i.e., volume of blown air, which adjusts the air exiting the one or more openings 117 based on the measured irradiance relative to the target irradiance. In most other embodiments, both the temperature and the irradiance of the lamp/s 32 are measured and the blower/s 30 is adjusted.

Figure 11:
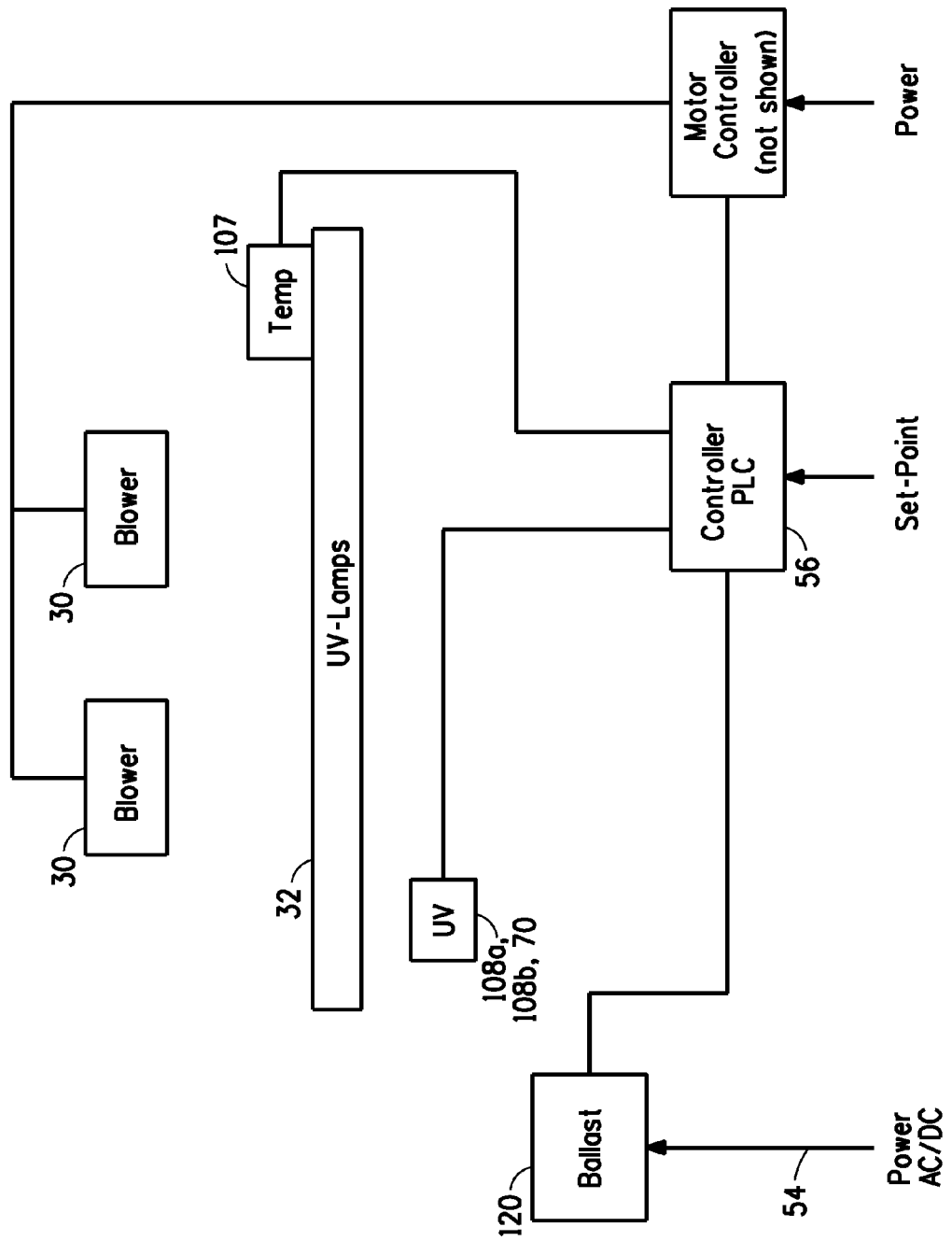
FIG. 11 is a schematic diagram of one embodiment of a simplified process control chart for an exposure apparatus that can use either or both of two independent embodiments of controlling output of one or more lamps in a method for exposing the photosensitive element. In one embodiment the exposing method includes controlling the air impinging one or more lamps with a programmable logic controller that is connected to blowers via a motor controller, and to a sensor for measuring temperature of the lamp/s, and/or to a sensor for measuring irradiation of ultraviolet radiation output from the lamp/s. In the other embodiment, the exposing method includes adjusting output of a lamp irradiation with an adjustable ballast and with a sensor measuring irradiation output from the lamp by the use of the programmable logic controller that is connected to the lamp/s, the adjustable ballast, and the irradiation sensor.

The simplified process control chart of FIG. 11 shows that the controller 56 is connected to the at least one blower 30 (via a motor controller, not shown) and to the lamp temperature sensor 107 that sends a signal of the measured temperature to the controller, and the controller reads the signal of the measured temperature and compares the measured temperature to the desired temperature, and signals the at least one blower to change its frequency or current and thereby adjust the volumetric rate of air through each of the slots that impinge the at least two lamps 32. The controller 56 connected to the at least one blower 30 (via a motor controller not shown) and to at least one of the irradiance sensors 108a,108b, wherein the controller reads the signal of the measured irradiance and compares the measured irradiance to the desired irradiance, and signals the at least one blower to change its frequency or current to thereby adjust the volumetric rate of air impinging the at least two lamps 32.

In some embodiments, during an exposure of a precursor only the temperature of one or more lamps is measured and adjustment/s are made at least to the blower/s to control or maintain the temperature of the lamp or lamps to a target lamp temperature. The present apparatus 10 maintains the temperature of the lamp or lamps 32 during exposure by using room temperature air. The heat generated by the lamp or lamps 32 during startup of the apparatus 10 is typically sufficient to warm the lamps to the desired target temperature range prior to starting exposure of the precursor. It is within the skill of one in the art to include a heater in the lamp assembly to quickly preheat the lamps to the target temperature. In some other embodiments, during an exposure of a precursor both the temperature and the irradiance of one or more lamps are measured and adjustment/s are made to the blower/s to maintain the temperature and the irradiance of the lamp or lamps to a target temperature and a target irradiance.

Since the air chamber 115 is pressurized to provide the desired air flow through the openings 117 of the sheet 112, after impinging the plurality of lamps 132 in some embodiments, the air can escape from the lamp housing, (i.e., a section of lamp housing, that is not the air chamber 115, and contains the plurality of lamps and optional glass sheet) and vents to the room. In one embodiment, after impinging the lamps 132 the heated air escapes from the section containing the lamps and is actively removed from the exposure apparatus 10 through one or more vents or openings (not shown) that are located around all or a portion of a perimeter of the exposure bed 25 (and within the perimeter of the safety switch bar 52 when the lamp housing assembly is at the exposure position Le) by one or more tangential fans (not shown) that are located in the base assembly 12 to exhaust the heated air into the room through gaps between the apparatus 10 and the floor. Optionally, the vents or openings at the perimeter of the exposure bed 25 can be connected to the one or more exhaust fans via one or more ducts in the base assembly 12 for the heated air to be expelled into the room. In alternate embodiments after impinging the plurality of lamps 132, the air can be actively removed from the section containing the lamps by one or more exhaust fans located in the lamp housing assembly 14. In one alternate embodiment (not shown), exhaust tubing can be interspersed between all or some of the plurality of lamps 132 in the plane of the lamps. The exhaust tubing is connected to the exhaust fan that pulls or collects the impinged air that is in the lamp housing section through openings in the tubing to the exhaust from the exposure apparatus. In another alternate embodiment (not shown), exhaust tubing can be located at the perimeter of the interior of the lamp housing section, and is connected to the exhaust fan that pulls or collects the impinged air that is in the lamp housing section through openings in the tubing to the exhaust from the exposure apparatus.

After the exposure, the precursor was exposed to the radiation emitting from the at least one lamp with sufficient irradiance to substantially complete the photochemical reaction/s in the composition layer of the precursor.

In yet another embodiment, after a period of time in which the one or more lamps are aging, the irradiance of one or more lamps 32 of the lamp assembly 102 is measured and adjustment/s are made at least by the adjustable ballast 120 to control or maintain the irradiance of the lamp or lamps 30 to a target irradiance.

Lamps age with use, i.e., the irradiance emitted by a lamp or its intensity diminishes as the lamp is used. A particular advantage of the present method for calibrating or controlling the irradiance of the lamps that are used to expose the photosensitive precursor 20 to actinic radiation in an embodiment of the exposure apparatus 10 that includes the lamp assembly 102 having lamps 32 with adjustable ballasts 120 is that only those lamp or lamps that have aged (accelerated) and no longer meet the irradiance or other conditions needs to be changed at any one time. This is unlike the prior art exposure apparatuses in which all lamps are changed even though only one or two or a few of the plurality of lamps have significantly aged.

In most embodiments of the exposure apparatus 10, an integrator (not shown), i.e., a radiation integration system, is used during exposure which evaluates the intensity or irradiance of the lamps illuminating the exposure bed where the precursor lies and compensates the time of an exposure according to the intensity of the radiation emitted by the lamps. The integrator is suitable to compensate for lamp aging to a certain degree, but either the exposures become too long or is insufficient to provide desired degree of photochemical reaction in the photosensitive element.

In one embodiment of operating the exposure apparatus 10 to control the radiation emitting from at least one lamp 32 in the exposure apparatus for exposing the precursor to actinic radiation, the exposure apparatus includes the lamp assembly 102 that has two or more lamps 32, i.e., a plurality of lamps 132, and an adjustable ballast 120 connected to each lamp 32, the air distribution assembly 105 having the air chamber 115 and two blowers 30, and the temperature sensor 107 for the lamp/s and the stationary irradiance sensors 108a 108b for the lamp/s and the scanning irradiance sensor 70. In the exposure apparatus 10 for exposing the photosensitive element or precursor 20 to actinic radiation, the method for controlling the irradiance of at least one lamp 32 having the adjustable ballast 120 may also be referred to herein as a calibration method. The following steps may occur in any order prior to the start of the exposure: the lamp housing assembly 14 is moved to the exposure location Le; the plurality of lamps 132 of the lamp assembly 102 is energized; and the blowers 30 in the air distribution assembly 105 are activated. In most embodiments, the calibration method does not need the precursor 20 to be exposed, and thus only the exposure bed 25 is exposed to the radiation emitting from the plurality of lamps 132. The calibration method for controlling the irradiance of at least one lamp 32 having the adjustable ballast 120 is conducted without the precursor 20 present and only periodically depending upon use of the system. In most embodiments, the calibration method determines the actual irradiance emitting from each lamp 32 of the plurality of lamps 132 and, if necessary, adjusts the irradiance emitting by the lamp to the target irradiance or in a target irradiance range with the adjustable ballast 120.

In most embodiments, the temperature of the lamp/s 32 is measured with the temperature sensor 107 and the measured lamp temperature is compared to the target lamp temperature, which in some embodiments is 40 to 45° C. The blowers 30 are activated accordingly as described above to maintain the temperature of the lamp/s at the target temperature. With the lamp housing assembly 14 in the second position Le, the arm member 140 of the scanning irradiance sensor 70 is rotated from its home position Ph to its scanning position Ps in which arm is align with the length of the tubular lamp. In the scanning position Ps, the rotation of the arm member 140 positions the end 141 with the sensor 70 under the lamp adjacent the front side of a lamp, and above the optional glass plate 110. In the home position Sh for scanning the scanning irradiance sensor 70 aligns or is superposed with the stationary irradiance sensor 108b. The controller 56 compares the measured irradiation from each of the scanning and stationary irradiance sensors 70 and 108b, as another check that the lamps 32 are appropriately ready for calibration. Calibration of one lamp 32 begins with the lamp temperature established at the target temperature. The scanning irradiance sensor 70 is moved by the transport assembly 72 in the passage 71 to orient the sensor 70 in one embodiment opposite or substantially opposite one lamp 32 of the plurality of lamps 132, to measure the irradiance of the lamp. In other embodiments, the scanning irradiance sensor 70 can be located at other positions, i.e., between lamps. Based on comparison of the measured irradiance to the target irradiance, the power to the one lamp is adjusted by the adjustable ballast 120, thereby adjusting the irradiance emitted from the at least one lamp to match the target irradiance. The sequence of moving the scanning irradiance sensor 70, measuring the irradiance of the lamp 32 with the scanning sensor 70, and adjusting the power to the measured lamp with the adjustable ballast 120 to thereby adjust the irradiance emitting from the lamp to a target irradiance is repeated for most if not all lamps of the plurality of lamps 132 in the lamp assembly 102. In some embodiments, the lamps 32 at the extreme ends of the bank of lamps, i.e., first and last lamps, is not measured and adjusted due to the influence of edge effects. In some embodiments, the lamps at the ends are adjusted based upon the adjustment made by the adjustable ballast 120 for a lamp adjacent to the end lamp.

In one embodiment, the lamps suitable for use have an irradiance capacity that is about 17 to about 30 mWatts/cm$^2$, which when used in conjunction with the adjustable ballasts 120 that adjust the power to the lamp provides an advantage to significantly extending the lifetime of the lamp/s before age off, i.e., when the lamps need to be replaced due to reduced irradiance capacity and/or energy density for suitable exposure times of the photosensitive element. This embodiment of a method of exposing by maintaining the irradiance of lamp/s using the adjustable ballast provides sufficient uniformity of energy density and irradiance to the precursor for exposure, and which in some cases, allows for only one or a two lamps to be replaced instead of all lamps. The adjustable ballast 120 is used to adjust the power to the lamp 32 and thereby adjust the irradiance emitted by the lamp, so that the irradiance emitted by the lamp can be kept uniform or substantially uniform over extended periods of time that includes many exposures of many precursors. A lamp 32 that is newly installed in the exposure apparatus 10 connects to the adjustable ballast 120 which is adjusted to so that the lamp has target irradiance of, for example, 20 mWatts/cm$^2$; and the adjustable ballast was adjusted, for example, to about 80% of the maximum power, i.e., about 20% of the power is used to maintain the target irradiance. As the lamp 32 ages, the measured irradiance (by the scanning sensor 70) has decreased from the targeted irradiance, and the adjustable ballast is adjusted, for example, to about 60% of maximum power, i.e., about 40% of the power is used to return the irradiance emitted by the lamp to the targeted irradiance. Since the adjustable ballast 120 can be adjusted to provide from about 5 to 100% of the maximum power from the power source to the lamp 32 or group of two, three, or four lamps.

Photosensitive Element

The photosensitive element is a printing precursor 20 capable of undergoing exposure to actinic radiation and treating, to form a surface suitable for printing. The photosensitive element is used for preparing relief printing forms and comprises at least one photopolymerizable layer. Relief printing forms encompass flexographic printing forms and letterpress printing forms. Relief printing is a method of printing in which the printing form prints from an image area, where the image area of the printing form is raised and the non-image area is depressed. In some other embodiments, the printing form resulting from the photosensitive element can be suitable for use in gravure or gravure-like printing applications. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recessed areas forming wells to carry the ink which transfer during printing. Optionally, the photosensitive element includes a support. Optionally, the photosensitive element includes a layer of an actinic radiation opaque material adjacent the photopolymerizable layer. In one embodiment, the photosensitive element includes a layer of photopolymerizable composition composed at least of a binder, at least one ethylenically unsaturated compound, and a photoinitiator. In another embodiment, the layer of the photopolymerizable composition includes an elastomeric binder, at least one ethylenically unsaturated compound, and a photoinitiator. In some embodiments, the relief printing form is an elastomeric printing form (i.e., the photopolymerizable layer is an elastomeric layer) to accommodate the compression necessary for contact printing.

Unless otherwise indicated, the term "relief printing plate or element" encompasses plates or elements in any form suitable for flexographic printing and for letterpress printing. Unless otherwise indicated, the terms "photosensitive element" and "printing form" encompass elements or structures in any form suitable as precursors for printing, including, but not limited to, flat sheets, plates, seamless continuous forms, cylindrical forms, plates-on-sleeves, and plates-on-carriers.

The support can be any flexible material that is conventionally used with photosensitive elements used to prepare relief printing plates. In some embodiments the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are suitable, as they typically are transparent to ultraviolet radiation and thereby accommodate backflash exposure for building a floor in the cylindrical printing element. The sleeve may also be made of non-transparent, actinic radiation blocking materials, such as nickel or glass epoxy. The support has a thickness typically from 0.002 to 0.250 inch (0.0051 to 0.635 cm). In some embodiments, the thickness for the sheet form is 0.003 to 0.016 inch (0.0076 to 0.040 cm). In some embodiments, the sleeve has a wall thickness from 4 to 80 mils (0.010 to 0.203 cm) or more.

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 and U.S. Pat. No. 3,036,913 to give suitable adhesion between the support and the photopolymerizable layer. Alternatively, the surface of the support on which the photopolymerizable layer resides can be treated to promote adhesion between the support and the photopolymerizable layer, with flame-treatment or electron-treatment, e.g., corona-treated The photosensitive element includes at least one layer of a photopolymerizable composition. As used herein, the term "photopolymerizable" is intended to encompass systems that are photopolymerizable, photocrosslinkable, or both. The photopolymerizable layer is a solid layer formed of the composition comprising a binder, at least one ethylenically unsaturated compound, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for relief printing. As used herein, the term "solid" refers to the physical state of the layer which has a definite volume and shape and resists forces that tend to alter its volume or shape. A solid layer of the photopolymerizable composition may be polymerized (photohardened), or unpolymerized, or both. In some embodiments, the layer of the photopolymerizable composition is elastomeric.

The binder is not limited and can be a single polymer or mixture of polymers. In some embodiments, the binder is an elastomeric binder. In other embodiments, the binder becomes elastomeric upon exposure to actinic radiation. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. In some embodiments, the elastomeric binders include poly(styrene/isoprene/styrene) block copolymers, poly(styrene/butadiene/styrene) block copolymers, and mixtures or combinations thereof. It is preferred that the binder be present in an amount of at least 50% by weight of the photosensitive composition.

The photopolymerizable composition contains at least one compound capable of addition polymerization that is compatible with the binder to the extent that a clear, noncloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide the photopolymerizable composition with suitable properties. The compound capable of addition polymerization (monomer) is present in at least an amount of 5% by weight of the elastomeric composition.

The photoinitiator can be any single compound or combination of compounds which is sensitive to actinic radiation, generating free radicals which initiate the polymerization of the monomer or monomers without excessive termination. Any of the known classes of photoinitiators may be used. Alternatively, the photoinitiator may be a mixture of compounds, one of which provides the free radicals when caused to do so by a sensitizer activated by radiation. Preferably, the initiator is sensitive to visible or ultraviolet radiation. Photoinitiators are generally present in amounts from 0.001% to 10.0% based on the weight of the photopolymerizable composition.

The photopolymerizable layer can contain other additives depending on the final properties desired. Additional additives to the photopolymerizable layer include spectral sensitizing agents, sensitizers, plasticizers, rheology modifiers, thermal polymerization inhibitors, colorants, processing aids, antioxidants, antiozonants, UV absorber and fillers. The additives should be compatible with the binder and monomer/s.

The thickness of the photopolymerizable layer can vary over a wide range depending upon the type of printing form desired, for example, from about 0.010 inches to about 0.250 inches or greater (about 0.025 cm to about 0.64 cm or greater). In some embodiments, the photopolymerization layer can range from about 0.002 to about 0.067 inch (about 0.005 cm to about 0.17 cm) in thickness.

One or more additional layers may be present on top of the photopolymerizable layer, that is, on a side of the photopolymerizable layer opposite the support. Depending on desired use, the additional layers may be opaque or transparent to actinic radiation. They may have one or more functions for the photosensitive element including, but not limited to, an elastomeric layer, a release layer, an actinic radiation opaque layer, a barrier layer, an adhesion modifying layer, and a layer which alters the surface characteristics of the photosensitive element. The additional layer may comprise at least one thermally removable layer on the photopolymerizable layer, such as disclosed by Fan et al. in U.S. Pat. No. 6,773,859 B2. Other suitable layers include those disclosed as elastomeric layers in the multilayer cover element described in U.S. Pat. No. 4,427,759 and U.S. Pat. No. 4,460,675. The photosensitive element can include a wax layer, and/or a barrier layer between an actinic radiation opaque layer and the photopolymerizable layer, or between the actinic radiation opaque layer and the elastomeric layer if present. The photosensitive element optionally includes a temporary cover sheet on top of the outermost layer of the photosensitive element.

In one embodiment the precursor includes an actinic radiation opaque layer on or adjacent the photopolymerizable layer or on top of the elastomeric layer if present. The actinic radiation opaque layer can form an integrated photomask, or in-situ mask, on the precursor, i.e., photosensitive element, by a digital method of mask formation. The actinic radiation opaque layer may also be referred to as an infrared (IR)-sensitive layer since the layer may have sensitivity to infrared laser radiation, and be capable of blocking actinic radiation. In most embodiments, IR-sensitive layer is opaque to actinic radiation that is, has an optical density greater than or equal to 2.5; can be imaged, preferably by ablating, with an infrared laser. The IR sensitive layer contains material having high absorption in the wavelength (infrared range between 750 and 20,000 nm. In most embodiments, inorganic pigments, such as, for example, carbon black, graphite, etc. is used to absorb the IR radiation. The quantity of infrared absorbing material is usually 0.1-40% by weight, relative to the total weight of the layer. To achieve the optical density of greater than or equal to 2.5 to block actinic radiation, the infrared-sensitive layer contains a material that prevents the transmission of actinic radiation. This actinic radiation blocking material can be the same or different than the infrared absorbing material, and can be, for example, dyes or pigments, and in particular the aforesaid inorganic pigments. The quantity of this material is usually 1-70% by weight relative to the total weight of the layer. The infrared-sensitive layer optionally includes a polymeric binder. Other auxiliary agents, such as plasticizers, coating aids, etc. are possible. In one embodiment, the infrared-sensitive layer may be coated or applied to an exterior surface of the photopolymerizable layer of the precursor. The thickness of the infrared-sensitive layer is usually 2 nm to 50 μm, preferably 4 nm to 40 μm. These infrared-sensitive layers and their preparation are described in detail, for example in WO 94/03838 and WO 94/3839.

In an alternate embodiment of digital method of mask formation, the photosensitive element will not initially include an infrared sensitive layer. In this case the infrared sensitive layer is the same as or substantially the same as the infrared sensitive layer included with the photosensitive layer as described above. A separate element bearing the infrared sensitive layer will form an assemblage with the photosensitive element such that the infrared sensitive layer is adjacent the surface of the photosensitive element opposite the support, which is typically the photopolymerizable layer. The separate element may include one or more other layers, such as ejection layers or heating layers, to aid in the digital exposure process. The assemblage is exposed imagewise with infrared laser radiation to selectively transfer the infrared sensitive layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. Only the portions of the infrared sensitive layer which were transferred will reside on the photosensitive element forming the in situ mask.

In another embodiment, the photomask image may be created on a separate carrier and then transferred by application of heat and/or pressure to the surface of the photopolymerizable layer opposite the support. The photopolymerizable layer is typically tacky and will retain the transferred image. The separate carrier can then be removed from the element prior to the pre-exposure and/or the imagewise exposure. The separate carrier may have an infrared sensitive layer that is imagewise exposed to laser radiation to selectively remove the material and form the image. An example of this type of carrier is LaserMask® imaging film by Rexam, Inc.

In yet another embodiment, digital mask formation can be accomplished by imagewise application of the radiation opaque material in the form of inkjet inks. Imagewise application of an ink-jet ink can be directly on the photopolymerizable layer or disposed above the photopolymerizable layer of the photosensitive element.

In yet another embodiment, a digital mask can be formed in a thermal imaging layer of a separate film, which is then laminated to the element, prior to imagewise exposure of the photosensitive element through the laminated mask as disclosed by Zwadlo, in U.S. Pat. No. 7,279,254. In another embodiment, a digital mask can be formed in-situ on the photosensitive element as described above, and a barrier membrane is laminated to the situ mask and the photosensitive layer, prior to imagewise exposure of the photosensitive element through the barrier membrane and in situ mask as disclosed in U.S. Pat. No. 8,158,331.

Regardless of the embodiment by which the mask is created for the photosensitive element, the mask will include opaque areas and "clear" or transparent areas, which represent a pattern of graphic information suitable for printing. The opaque areas of the mask prevent the photopolymerizable material beneath from being exposed to the radiation and hence those areas of the photopolymerizable layer covered by the dark areas do not polymerize, i.e., uncured portions of the layer. The "clear" areas of the mask expose the photopolymerizable layer to actinic radiation and polymerize or crosslink, i.e., cured portions of the layer.

Imagewise exposure is carried out by exposing the photosensitive element through an image-bearing photomask using at least one embodiment of the present exposure apparatus and method. In most embodiments, the photomask is integrated with the precursor as described above. In most embodiments the integrated photomask is formed on the precursor (i.e., photosensitive element) by a digital method in which the precursor is imagewise exposed to infrared laser radiation to form an integrated photomask on the precursor, prior to exposure to actinic radiation by the present exposure apparatus. The integrated photomask may also be referred to as an in-situ mask. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. A suitable infrared laser exposure apparatus is disclosed by Fan et al. in U.S. Pat. Nos. 5,654,125 and 5,760,880. In so-called digital imaging, the radiation opaque layer is exposed imagewise to infrared laser radiation to form the image on or disposed above the photopolymerizable layer, i.e., the in-situ mask. The infrared laser radiation can selectively remove, e.g., ablate or vaporize, the infrared sensitive layer (i.e., radiation opaque layer) from the photopolymerizable layer, as disclosed by Fan in U.S. Pat. No. 5,262,275; U.S. Pat. No. 5,719,009; and U.S. Pat. No. 6,238,837. The integrated photomask remains on the photosensitive element for subsequent step of exposure to actinic radiation by the present exposure apparatus. The infrared laser radiation can selectively transfer the infrared sensitive layer to the photopolymerizable layer as described above.

One or more embodiments of the present exposure apparatus and method can also be used for an overall back exposure. An overall or blanket exposure of the precursor through the support, i.e., back of precursor, may be conducted to polymerize a predetermined thickness of the photopolymer layer adjacent the support. This polymerized portion of the photopolymer layer is often designated a floor. The floor provides improved adhesion between the photopolymerizable layer and the support, helps highlight dot resolution and also establishes the depth of the plate relief. The floor thickness varies with the time of exposure, exposure source, etc. All radiation sources suitable for imagewise main exposure may be used. The exposure is generally for 1-30 minutes. In some embodiments, the overall back exposure is conducted during the manufacture of the (uncured) precursor, and thus simplifies the steps necessary for a customer to convert the precursor to a printing form having a relief surface. In other embodiments, the overall back exposure may be conducted before or after imagewise exposure by a customer.

The precursor is imagewise exposed or blanket exposed, i.e., overall exposed, to actinic radiation in the present exposure apparatus. The precursor is exposed by mounting the precursor on the exposure bed, positioning the plurality of tubular lamps adjacent and in relatively close proximity to the precursor, and energizing the tubular lamps to emit the actinic radiation. Upon imagewise exposure, the radiation-exposed areas of the photopolymerizable layer are converted to the insoluble state with no significant polymerization or crosslinking taking place in the unexposed areas of the layer.

After the treatment step, the precursor can be uniformly post-exposed and light finished by the present exposure apparatus to ensure that the photopolymerization process is complete and that the so formed printing form will remain stable during printing and storage. This post-exposure step can utilize the same radiation source as the imagewise main exposure. Furthermore, if the surface of the precursor, i.e., print form with the relief surface, is still tacky, detackification treatments may be applied. Such methods, which are also called "finishing", are well known in the art. For example, tackiness can be eliminated by a treatment of the print form with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. In some embodiments, the post-exposure and the finishing exposure are done at the same time on the precursor 20 using the present exposure apparatus 10 that has both sources of radiation, which in the embodiment shown is located in drawer 13a, and the precursor is placed in drawer 13b.

Following imagewise exposure to actinic radiation through the mask, the precursor is treated to remove unpolymerized areas in the photopolymerizable layer and thereby form a relief image. The treating step removes at least the photopolymerizable layer in the areas that were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerised areas of the photopolymerizable layer. For precursors including an IR-sensitive layer for digital formation of the mask, the treating step that forms the relief image in the photopolymerizable layer may also remove the mask image (which had been exposed to actinic radiation).

Treating of the photosensitive element includes (1) "wet" development wherein the precursor is contacted with a suitable developer solution to washout unpolymerized areas and/or (2) "dry" development wherein the precursor is heated to a development temperature which causes the unpolymerized areas of the photopolymerizable layer to melt or soften or flow and then are removed. Dry development may also be called thermal development. It is also contemplated that combinations of wet and dry treatment can be used to form the relief.

Wet development can be carried out at room temperature but usually is carried out at about 80 to 100° F. The developers can be organic solvents, aqueous or semi-aqueous solutions, and water. The choice of the developer will depend primarily on the chemical nature of the photopolymerizable material to be removed. It is well within the skill of a person in the art to select a suitable solvent developer. Development time can vary based on the thickness and type of the photopolymerizable material, the solvent being used, and the equipment and its operating temperature. Developer can be applied in any convenient manner, including immersion, spraying and brush or roller application. Washout can be carried out in an automatic processing unit which uses a developer and optionally mechanical brushing action to remove the uncured portions of the plate, leaving a relief constituting the exposed image and the floor. Following treatment by developing in solution, the treated precursors are generally blotted or wiped dry, and then more fully dried in a forced air or infrared oven. Drying times and temperatures may vary based on equipment design, air flow, and materials.

Treating the precursor thermally includes heating the photosensitive element to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the precursor includes one or more additional layers on the photopolymerizable layer, it is desirable (but not necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. A preferred method for removing the uncured portions is by contacting an outermost surface of the element to an absorbent surface, such as a development medium, to absorb or wick away or blot the melt portions.

The term "melt" is used to describe the behavior of the unirradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth.

Apparatuses suitable for thermally developing the photosensitive element are disclosed by Peterson et al. in U.S. Pat. No. 5,279,697, and also by Johnson et al. in U.S. Pat. No. 6,797,454. The photosensitive element may be placed on a drum or a planar surface in order for thermal treatment to be carried out.

The development medium is selected to have a melt temperature exceeding the melt or softening or liquefying temperature of the unirradiated or uncured portions of the radiation curable composition and having good tear resistance at the same operating temperatures. The development medium is selected from non-woven materials, paper stocks, fibrous woven material, open-celled foam materials, porous materials that contain more or less a substantial fraction of their included volume as void volume. The development medium should also possess a high absorbency for the molten elastomeric composition.

What is claimed is:

1. An exposure apparatus for exposing a photosensitive element to actinic radiation, comprising:
   an exposure bed for supporting the photosensitive element;
   a lamp assembly disposed adjacent the exposure bed comprising:
      at least two lamps that are adjacent to each other to expose the photosensitive element with the actinic radiation at a target irradiance; and
      an adjustable ballast connected to at least one lamp of the at least two lamps to adjust power received by the one lamp;
   a sensor disposed adjacent at least one lamp of the at least two lamps for measuring irradiance impinging the exposure bed; and
   a controller that adjusts the power to the adjustable ballast based upon comparison of the measured irradiance to the target irradiance to adjust the irradiance emitted from the at least one lamp to match the target irradiance,
wherein the at least two lamps comprises a plurality of tubular lamps that are adjacent and parallel to each other, and further comprising means for moving the irradiance sensor to measure the irradiance emitting from the plurality of lamps at a first location and at a second location, or to measure irradiance emitting from each of the plurality of lamps.

2. The apparatus of claim 1 wherein the at least two lamps comprises a plurality of tubular lamps that are adjacent and parallel to each other, and further comprising one adjustable ballast for each lamp of the plurality of lamps.

3. The apparatus of claim 1 wherein the at least two lamps comprises a plurality of tubular lamps that are adjacent and parallel to each other and that are formed into groups selected from one lamp to four lamps, wherein there is one adjustable ballast for each lamp group.

4. The apparatus of claim 1 wherein the irradiance sensor is located in proximity to the exposure bed, and further comprising a second sensor located in proximity to one lamp of the at least two lamps for measuring irradiance emitting from the one lamp, wherein the controller compares the measured irradiance of the bed sensor to the measured irradiance of the second sensor, before adjusting power to the adjustable ballast.

5. The apparatus of claim 1 wherein each lamp is capable of emitting ultraviolet radiation and at a range of irradiance of about 15 to about 35 mWatt/cm$^2$.

6. The apparatus of claim 1 further comprising a sensor for measuring a temperature of one lamp of the at least two lamps.

7. A method for controlling radiation emitting from a lamp in an exposure apparatus for exposing a photosensitive element to the radiation, comprising:
   a) irradiating an exposure bed with radiation at a target irradiance using a lamp assembly comprising at least two tubular lamps that are adjacent to each other, and an adjustable ballast connected to at least one lamp of the at least two lamps wherein the ballast adjusts power received by the one lamp;
   b) measuring irradiance emitting from the at least one lamp in proximity of the exposure bed;
   c) adjusting the power to the ballast of one lamp based on comparison of the measured irradiance to the target irradiance to adjust the irradiance emitted from the at least one lamp to match the target irradiance; and
   d) moving a sensor for measuring the irradiance in proximity of the exposure bed from a first position adjacent the one lamp to a second position adjacent a second lamp of the at least two lamps that is connected to a second adjustable ballast for adjusting power received by the second lamp; and, conducting steps b) and c) for the second lamp.

8. The method of claim 7 wherein the at least two lamps comprises a plurality of tubular lamps that are adjacent and parallel to each other and that are formed into groups selected from one lamp to four lamps, wherein the adjusting the power to the adjustable ballast adjusts the irradiance emitted for at least one group of lamps.

9. The method of claim 7 further comprising measuring temperature of any of the at least two lamps and maintaining the temperature of the at least two lamps in a target temperature range during the steps b) and c) for each lamp.

10. The method of claim 7 further comprising measuring temperature of at least one lamp prior to step b), and starting step b) after the measure temperature matches a target temperature or is in a target temperature range.

11. The method of claim 7 wherein the at least two lamps comprises a plurality of tubular lamps that are adjacent and parallel to each other, and further comprising measuring irradiance emitting from one lamp of the at least two lamps at a location in proximity to the plurality of lamps.

12. The method of claim 11 further comprising comparing the measured irradiance in proximity of the exposure bed to the measured irradiance emitting from the one lamp in proximity to the plurality of lamps, and starting step b) after the measured irradiance in proximity of the exposure bed is the same as the measured irradiance emitting from the lamp.

13. The method of claim 7 further comprising using about 5% to about 100% of a maximum power to the adjustable ballast for the step of adjusting the power to the adjustable ballast of one lamp.

14. The method of claim 7 further comprising using about 20% to about 90% of a maximum power to the adjustable ballast for the step of adjusting the power to the adjustable ballast of one lamp.

15. The method of claim 7 wherein the at least two lamps comprises a plurality of tubular lamps that are adjacent and parallel to each other and that are all irradiating prior to step b).

16. The method of claim 7 further comprising placing the photosensitive element on the exposure bed, and exposing the photosensitive element to the radiation irradiating from the at least two lamps after adjusting the power to the ballast to adjust the irradiance emitted from the at least one lamp to match the target irradiance.

17. The method of claim 7 wherein the target irradiance is 17 to 21 mWatt/cm$^2$.

18. A method for preparing a relief printing form from a photosensitive element having a layer of a photopolymerizable composition comprising:
   controlling radiation emitting from a lamp in an exposure apparatus according the method of claim 7, such that the irradiance emitted from the at least two lamps is at the target irradiance;
   imagewise exposing the photosensitive element through a mask to the radiation emitting at the target irradiance, forming at least a cured portion and at least a uncured portion of the layer; and
   treating the exposed element to remove the uncured portions thereby forming a relief structure suitable for printing.

* * * * *